(12) United States Patent
Toyoda

(10) Patent No.: US 12,308,148 B2
(45) Date of Patent: May 20, 2025

(54) SEMICONDUCTOR RESISTANCE DEVICE

(71) Applicant: Fuji Electric Co., Ltd., Kanagawa (JP)

(72) Inventor: Yoshiaki Toyoda, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 393 days.

(21) Appl. No.: 17/978,907

(22) Filed: Nov. 1, 2022

(65) Prior Publication Data
US 2023/0207162 A1 Jun. 29, 2023

(30) Foreign Application Priority Data

Dec. 28, 2021 (JP) .................... 2021-213862

(51) Int. Cl.
H01C 7/06 (2006.01)
H01C 7/02 (2006.01)
H01C 7/04 (2006.01)

(52) U.S. Cl.
CPC .............. H01C 7/06 (2013.01); H01C 7/021 (2013.01); H01C 7/022 (2013.01); H01C 7/041 (2013.01); H01C 7/042 (2013.01)

(58) Field of Classification Search
CPC .......... H01C 7/06; H01C 7/021; H01C 7/022; H01C 7/041; H01C 7/042
See application file for complete search history.

(56) References Cited

U.S. PATENT DOCUMENTS 4,599,576 A * 7/1986 Yoshida .............. H01L 27/0251 327/434
5,448,103 A * 9/1995 de Wit ................. H10D 84/209 257/E27.047
2017/0243934 A1 * 8/2017 Ema ..................... H01L 27/0802

FOREIGN PATENT DOCUMENTS

| CN | 106328649 | * | 9/2019 | ......... H01L 21/2253 |
| JP | 60-128651 A | | 7/1985 | |
| JP | 61-191061 A | | 8/1986 | |
| JP | 61-256756 A | | 11/1986 | |
| JP | S63211764 | * | 9/1988 | |
| JP | H0233967 | * | 2/1990 | |
| JP | 3-85758 A | | 4/1991 | |

(Continued)

OTHER PUBLICATIONS

JPS63211764 machine translation (Year: 1988).*
JPH0233967 machine translation (Year: 1990).*
CN106328649 machine translation (Year: 2019).*

Primary Examiner — Kyung S Lee
(74) Attorney, Agent, or Firm — CHEN YOSHIMURA LLP

(57) ABSTRACT

A semiconductor resistance device includes a polysilicon resistance region; a first contact region in the resistance region, the first contact region having the same conductivity type as the resistance region and having a higher impurity concentration than the resistance region; a first wiring electrically connected to one end of the resistance region via a plurality of first vias; and a second wiring electrically connected to the other end of the resistance region via a plurality of second vias. At least one of the plurality of first vias and the plurality of second vias is in contact with the first contact region so as to form a low resistance contact structure, and at least another one of the plurality of first vias and the plurality of second vias forms a high resistance contact structure that has a contact resistance higher than a contact resistance of the low resistance contact structure.

11 Claims, 18 Drawing Sheets

(56) References Cited

FOREIGN PATENT DOCUMENTS

| | | |
|---|---|---|
| JP | 6-53417 A | 2/1994 |
| JP | 9-17952 A | 1/1997 |
| JP | 9-36310 A | 2/1997 |
| JP | 2017-147380 A | 8/2017 |

\* cited by examiner

SEMICONDUCTOR RESISTANCE DEVICE

BACKGROUND OF THE INVENTION

Technical Field

The present invention relates to a semiconductor resistance device.

Background Art

As a conventional resistance device (resistor element), a configuration is known in which a p-type polysilicon resistor and an n-type polysilicon resistor are connected in series or in parallel to form one resistor. In such a resistance element, by appropriately selecting the number of sheets of the p-type polysilicon resistor with a positive temperature coefficient and the number of sheets of the n-type polysilicon resistor with a negative temperature coefficient, the characteristic change due to temperature is offset (cancelled), and a resistor with a small temperature coefficient can be realized as a whole.

In the contact portions of the p-type polysilicon resistor and the n-type polysilicon resistor, the contact resistance is reduced as much as possible by forming a contact region with a high impurity concentration and/or by increasing the number of contacts arranged in parallel so that the characteristics of the resistance element is adversely affected.

Patent Documents 1 to 8 respectively disclose configurations for adjusting the temperature coefficient of the entire resistor by connecting two types of resistors, which are polysilicon resistors or diffusion layers, having different temperature coefficients, in series or in parallel.

RELATED ART DOCUMENT

Patent Document

Patent Document 1: Japanese Patent Application Laid-Open Publication No. 2017-147380
Patent Document 2: Japanese Patent Application Laid-Open Publication No. 60-128651
Patent Document 3: Japanese Patent Application Laid-Open Publication No. 61-191061
Patent Document 4: Japanese Patent Application Laid-Open Publication No. 61-256756
Patent Document 5: Japanese Patent Application Laid-Open Publication No. 3-85758
Patent Document 6: Japanese Patent Application Laid-Open Publication No. 6-53417
Patent Document 7: Japanese Patent Application Laid-Open Publication No. 9-17952
Patent Document 8: Japanese Patent Application Laid-Open Publication No. 9-36310

SUMMARY OF THE INVENTION

However, in the configurations described in Patent Documents 1 to 8, it is necessary to combine two types of resistors with different temperature coefficients, making it difficult to reduce the size of the resistor element.

In view of the above problems, an object of the present invention is to provide a semiconductor device capable of downsizing a resistance element having a small temperature coefficient.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, comprising: a polysilicon layer; a resistance region provided in the polysilicon layer; a first contact region provided in the resistance region, the first contact region having the same conductivity type as the resistance region and having a higher impurity concentration than the resistance region; a first wiring electrically connected to one end of the resistance region via a plurality of first vias; and a second wiring electrically connected to the other end of the resistance region via a plurality of second vias, wherein at least one of the plurality of first vias and the plurality of second vias is in contact with the first contact region so as to form a low resistance contact structure with respect to the resistance region, and wherein at least another one of the plurality of first vias and the plurality of second vias forms a high resistance contact structure with respect to the resistance region that has a contact resistance higher than a contact resistance of the low resistance contact structure.

According to the present invention, it is possible to provide a semiconductor device capable of miniaturizing a resistance element having a small or near-zero temperature coefficient.

It is to be understood that both the foregoing general description and the following detailed description are exemplary and explanatory, and are intended to provide further explanation of the invention as claimed.

DETAILED DESCRIPTION OF EMBODIMENTS

Figure 1:
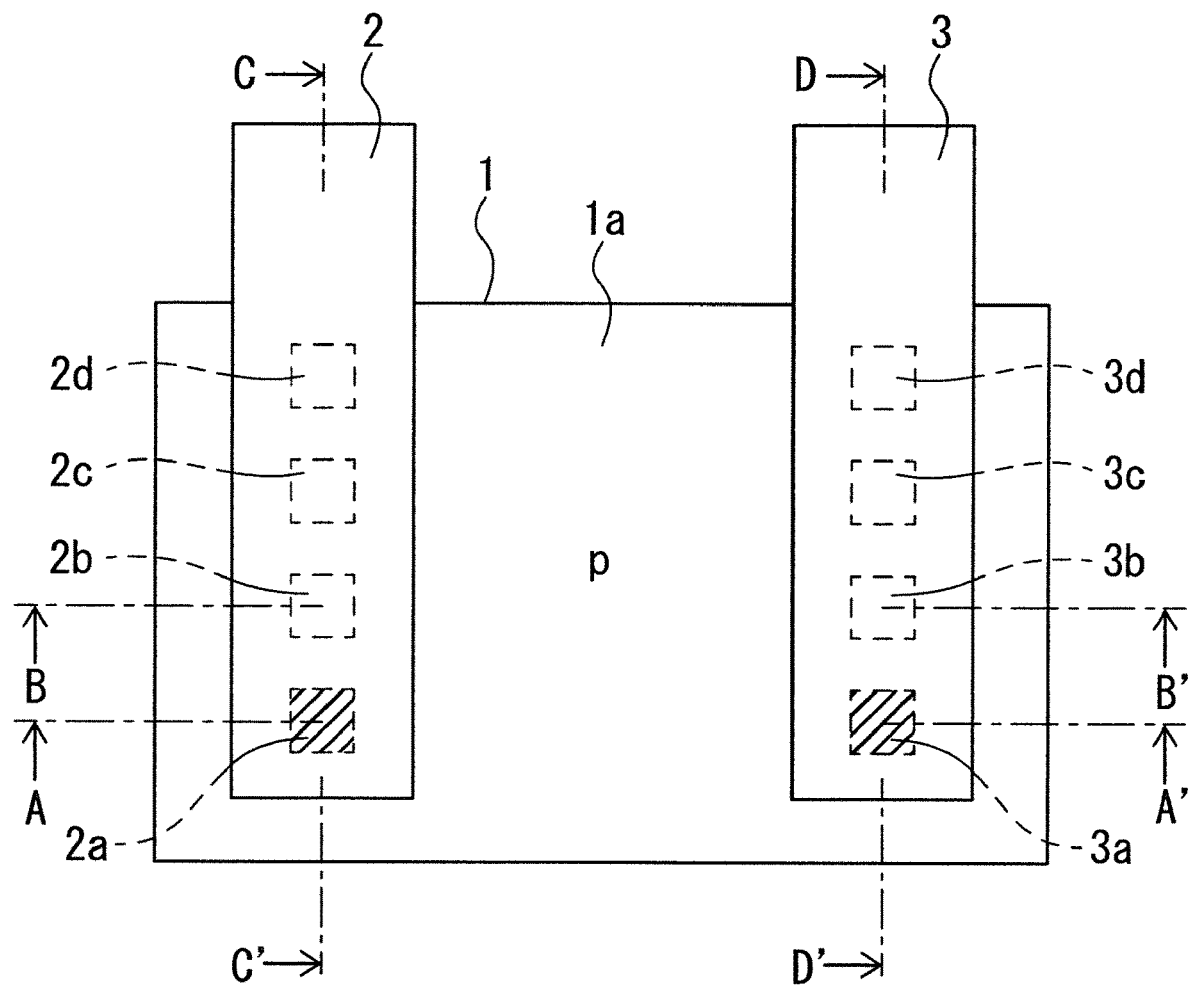
FIG. 1 is a plan view of a semiconductor device according to a first embodiment.

The first to seventh embodiments of the present invention will be described below with reference to the drawings. In the description of the drawings, the same or similar parts are denoted by the same or similar reference numerals, and overlapping descriptions are omitted. However, the drawings are schematic, and the relationship between the thickness and the planar dimensions, the ratio of the thickness of each layer, and the like may differ from the actual ones. In addition, portions having different dimensional relationships and ratios may also be included between drawings. In addition, the first to seventh embodiments shown below exemplify devices and methods for embodying the technical idea of the present invention. The technical idea of the present invention is not limited by specific shapes, structures, arrangements, etc., described below.

Also, in this specification, definitions of directions such as up and down are merely definitions for convenience of explanation, and do not limit the technical idea of the present invention. For example, if an object is observed after being rotated by 90°, it will be read with its top and bottom converted to left and right, and if it is observed after being rotated by 180°, it will of course be read with its top and bottom reversed.

In addition, in this specification, "+" or "−" attached to "p" or "n" indicating the conductivity type of a semiconductor region indicates a relatively higher (+) or lower (−) impurity concentration than the corresponding semiconductor region without "+" or "−" respectively. However, even if the same "p" and "p" are attached to the semiconductor regions, it does not mean that the impurity concentrations of the respective semiconductor regions are strictly the same. Furthermore, in the following description, members or regions with the feature, "p-type" or "n-type" mean members or regions made of semiconductor material, even if there is no such explicit description.

First Embodiment

A semiconductor device according to a first embodiment includes a polysilicon layer 1, as shown in FIG. 1. The polysilicon layer 1 has a rectangular planar pattern whose longitudinal direction is the left-right direction in FIG. 1. Polysilicon layer 1 is provided with a p-type resistance region (p-type diffusion region) 1a. The p-type resistance region 1a is formed over the entire upper surface of the polysilicon layer 1 and has a rectangular planar pattern.

A first wiring 2 is provided above one end in the longitudinal direction of the rectangle formed by the p-type resistance region 1a. The first wiring 2 has an elongated planar pattern and extends in a direction orthogonal to the longitudinal direction of the rectangle formed by the p-type resistance region 1a. The first wiring 2 is electrically connected to the p-type resistance region 1a through a plurality of vias 2a to 2d in the lower layer of the first wiring 2. The vias 2a to 2d are provided apart from each other along the longitudinal direction of the first wiring 2.

A second wiring 3 is provided above the other end in the longitudinal direction of the rectangle formed by the p-type resistance region 1a. The second wiring 3 has an elongated planar pattern and extends in a direction orthogonal to the longitudinal direction of the rectangle formed by the p-type resistance region 1a. The second wiring 3 is electrically connected to the p-type resistance region 1a through a plurality of vias 3a to 3d under the second wiring 3. The vias 3a to 3d are provided apart from each other along the longitudinal direction of the second wiring 3.

In FIG. 1, the vias 2a to 2d under the first wiring 2 and the vias 3a to 3d under the second wiring 3 are schematically shown by dashed lines. In FIG. 1, four vias 2a to 2d and four vias 3a to 3d are connected to the first wiring 2 and the second wiring 3, respectively, but the number of vias through which the first wiring 2 and the second wiring 3 are connected is not particularly limited.

Figure 2:
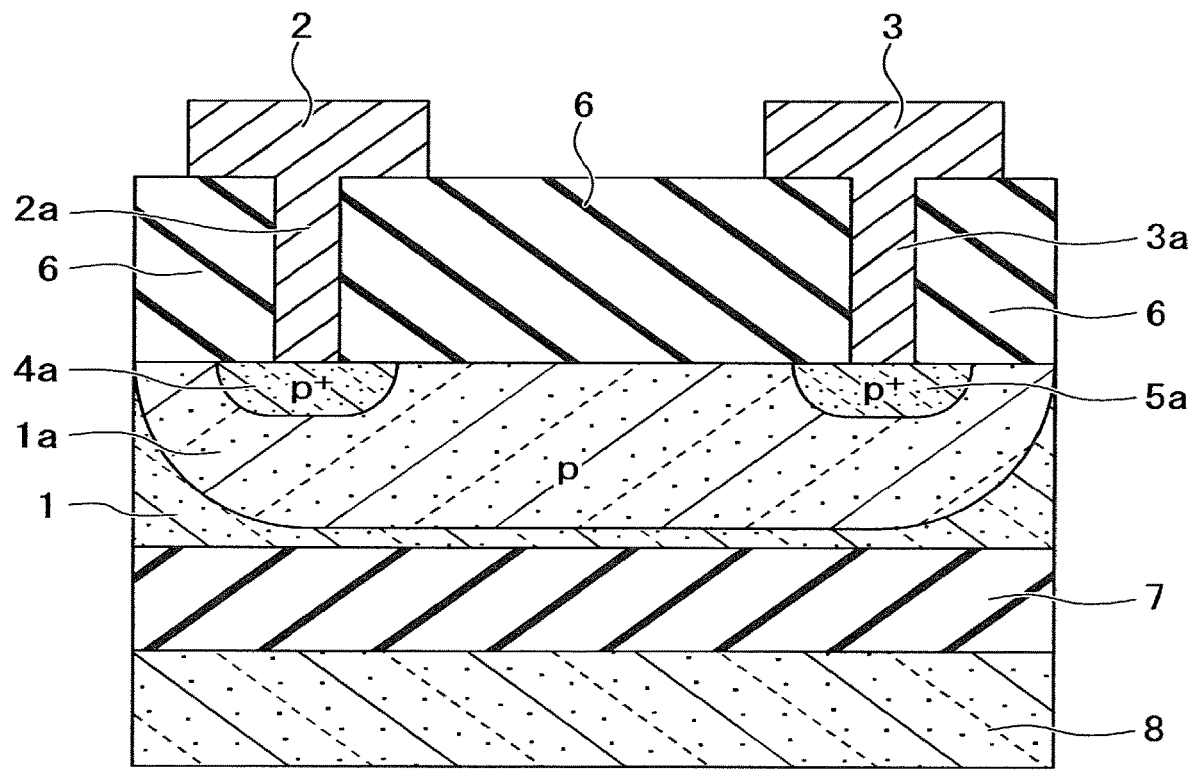
FIG. 2 is a cross-sectional view cut along line the A-A' in FIG. 1.
Figure 3:
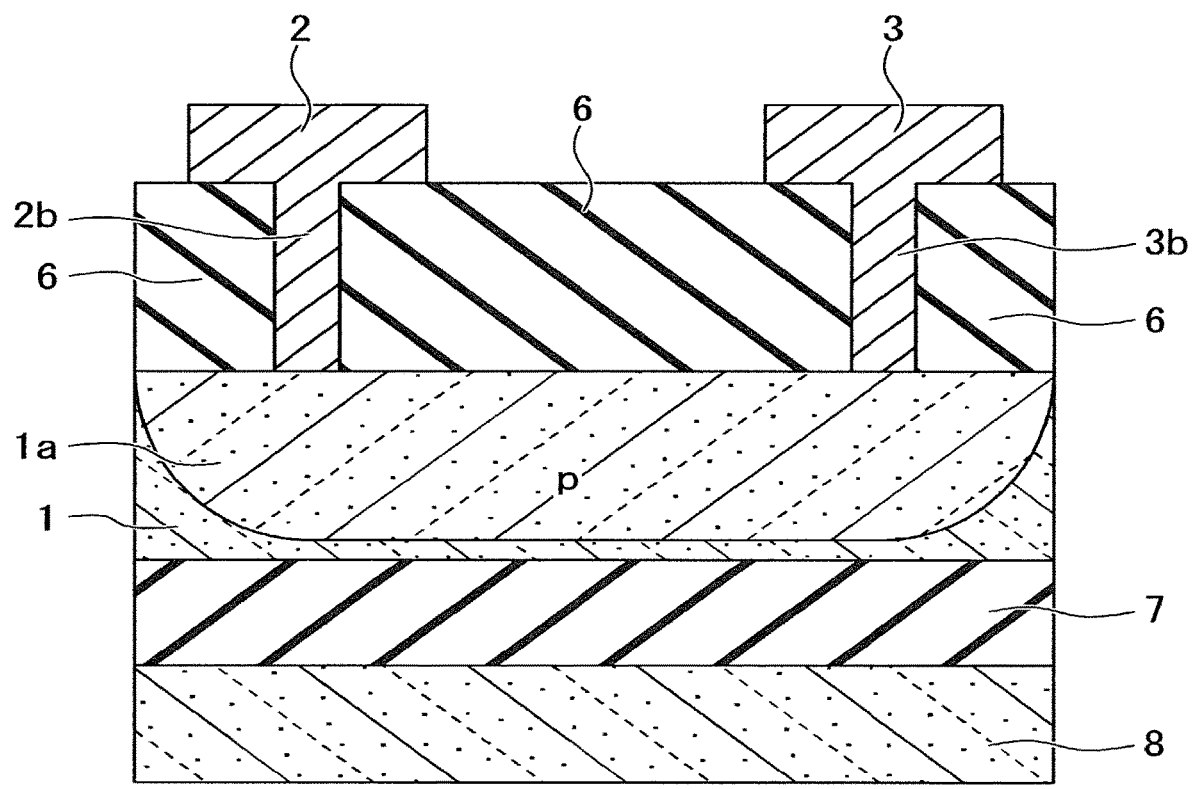
FIG. 3 is a cross-sectional view taken along the line B-B' of FIG. 1.
Figure 4:
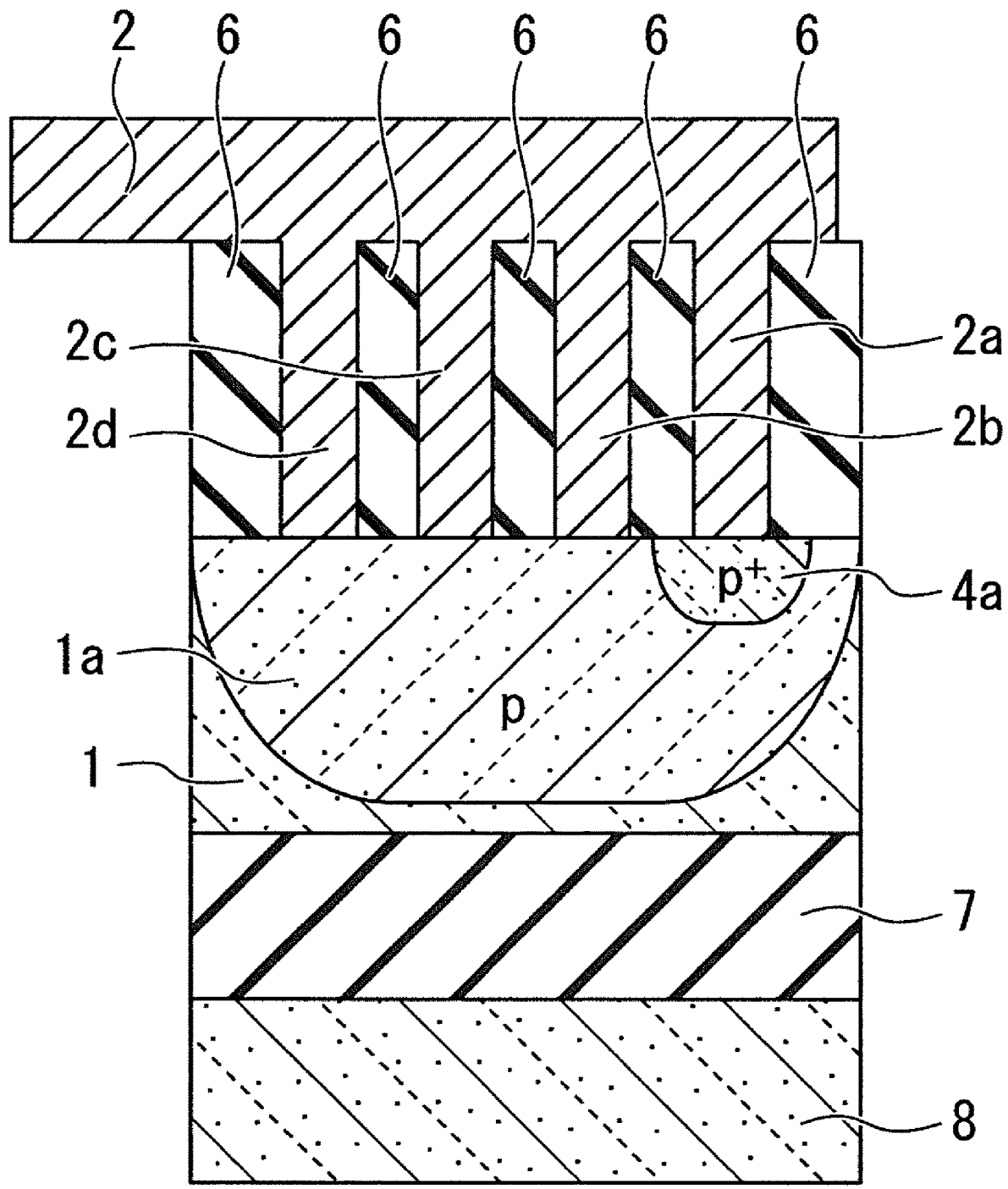
FIG. 4 is a sectional view taken along the line C-C' of FIG. 1.
Figure 5:
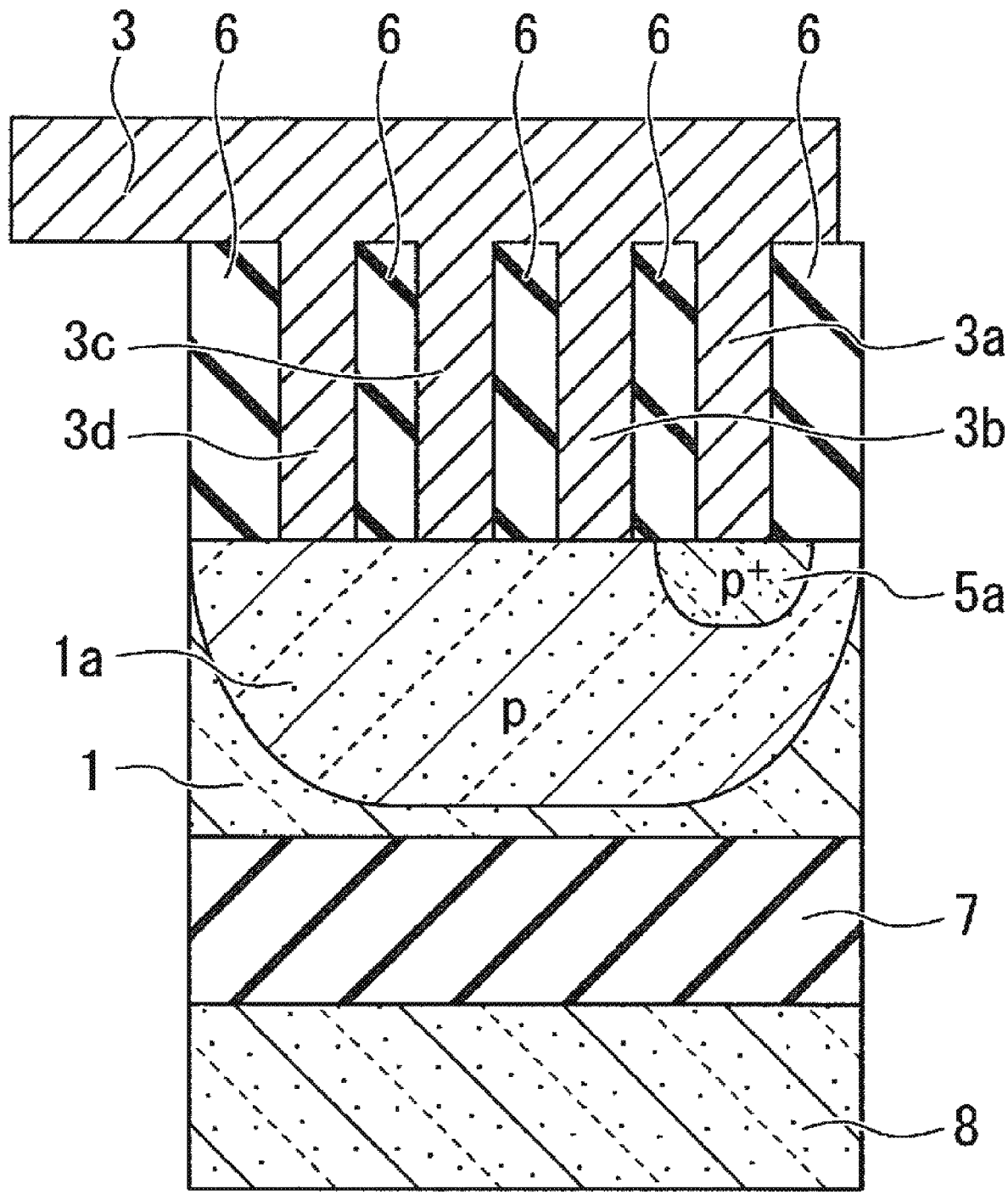
FIG. 5 is a cross-sectional view taken along the line D-D' of FIG. 1.

FIG. 2 shows a cross section cut along the line A-A' in FIG. 1, FIG. 3 shows a cross section cut along the line B-B' in FIG. 1, FIG. 4 shows a cross section cut along the line C-C' in FIG. 1, and FIG. 5 shows a cross section taken along the line D-D' of FIG. 1. As shown in FIGS. 2 to 5, the polysilicon layer 1 is provided on the substrate 8 with the insulating film 7 interposed therebetween. The substrate 8 is composed of a semiconductor substrate such as a silicon (Si) substrate. The insulating film 7 is composed of, for example, an element isolation insulating film.

A p-type resistance region 1a is provided on the upper portion of the polysilicon layer 1. The p-type resistance region 1a is formed by ion-implanting a p-type impurity such as boron (B) into the polysilicon layer 1 and heat-treating it. The impurity concentration of the p-type resistance region 1a can be appropriately adjusted by adjusting the dose during ion implantation.

As shown in FIGS. 2, 4 and 5, in upper portions of the p-type resistance region 1a, a p$^+$-type contact regions 4a and 5a (which each have the same conductivity type as the p-type resistance region 1a and have a higher impurity concentration than the p-type resistance region 1a) are provided so as to be spaced apart from each other. The p$^+$-type contact regions 4a and 5a are formed by ion-implanting a p-type impurity such as boron (B) into the polysilicon layer 1 and heat treating it. The impurity concentration of the p$^+$-type contact regions 4a and 5a can be appropriately adjusted by adjusting the dose during ion implantation.

As shown in FIGS. 2 to 5, an insulating film (interlayer insulating film) 6 is provided on the polysilicon layer 1. The first wiring 2 and the second wiring 3 are provided on the interlayer insulating film 6. Openings (through holes) are provided in the interlayer insulating film 6. The first wiring 2 is electrically connected to the p-type resistance region 1a through vias 2a to 2d passing through the openings of the interlayer insulating film 6. The second wiring 3 is electrically connected to the p-type resistance region 1a through vias 3a to 3d passing through the opening of the interlayer insulating film 6.

As materials for the first wiring 2, the second wiring 3, and the vias 2a to 2d, 3a to 3d, metals such as aluminum (Al) and Al alloys can be used. The Al alloys include Al-silicon (Si), Al-copper (Cu)—Si, Al—Cu, and the like.

In the semiconductor device according to the first embodiment, the contact resistance of some of the contact portions of the vias 2a to 2d and 3a to 3d are made different from the contact resistance of the other of the contact portions of the vias 2a to 2d and 3a to 3d. Here, among the contact structures formed by the vias 2a to 2d and 3a to 3d, respectively, a contact structure with a relatively low contact resistance is defined and referred to as a "low resistance contact structure" and a contact structure with a relatively high contact resistance. is defined and referred to as a "high resistance contact structure".

That is, as shown in FIGS. 2 and 4, on the side of the first wiring 2, the lower end of the via 2a is directly and physically in contact with the $p^+$-type contact region 4a, and the via 2a and the $p^+$-type contact region 4a forms a low resistance contact structure (2a, 4a). On the other hand, as shown in FIGS. 3 and 4, the lower ends of the vias 2b-2d are directly and physically in contact with the p-type resistance region 1a, and the vias 2b-2d and the p-type resistance region 1a form high resistance contact structures (2b, 1a), (2c, 1a), (2d, 1a). The contact resistances of the high resistance contact structures (2b, 1a), (2c, 1a), (2d, 1a) are higher than that of the low resistance contact structure (2a, 4a). The low resistance contact structure (2a, 4a) and the high resistance contact structures (2b, 1a), (2c, 1a), (2d, 1a) are short-circuited through the first wiring 2.

As shown in FIGS. 2 and 5, on the second wiring 3 side, the lower end of the via 3a is directly and physically in contact with the $p^+$-type contact region 5a, and the via 3a and the $p^+$-type contact region 5a form a low resistance contact structure (3a, 5a). As shown in FIGS. 3 and 5, the bottom ends of the vias 3b-3d are directly and physically in contact with the p-type resistance region 1a, and the vias 3b-3d and the p-type resistance region 1a form high resistance contact structures (3b, 1a), (3c, 1a), (3d, 1a). The low resistance contact structure (3a, 5a) and the high resistance contact structures (3b, 1a), (3c, 1a), (3d, 1a) are short-circuited through the second wiring 3.

In FIG. 1, the vias 2a and 3a constituting the low resistance contact structures (2a, 4a) and (3a, 5a) are hatched, and the vias 2b-2d, 3b-3d constituting the high resistance contact structures (2b, 1a), (2c, 1a), (2d, 1a), (3b, 1a), (3c, 1a), (3d, 1a) are not hatched. As shown in FIG. 1, the low resistance contact structures (2a, 4a) and the high resistance contact structures (2b, 1a), (2c, 1a), (2d, 1a) on the side of the first wiring 2, and the low resistance contact structures (3a, 5a) and the high resistance contact structures (3b, 1a), (3c, 1a), (3d, 1a) on the side of the second wiring 3 are arranged symmetrically (line symmetrically).

Here, the contact resistance between one of these p-type polysilicon regions, which are the p-type resistance region 1a and the $p^+$-type contact regions 4a, 5a, etc., and the metal, which is the vias 2a-2d, 3a-3d, etc., becomes lower as the impurity concentration of the p-type polysilicon regions becomes higher. The contact resistance becomes higher as the impurity concentration of the p-type polysilicon region becomes lower. The contact resistance between p-type polysilicon and metal has a negative temperature coefficient when the impurity concentration of p-type polysilicon is relatively low. The sign of the temperature coefficient is reversed as the impurity concentration becomes higher, and the contact resistance comes to have a positive temperature coefficient when the impurity concentration of p-type polysilicon is relatively high.

Also, the sheet resistance of p-type polysilicon becomes lower as the impurity concentration of p-type polysilicon becomes higher, and becomes higher as the impurity concentration of p-type polysilicon becomes lower. The sheet resistance of p-type polysilicon has a negative temperature coefficient when the impurity concentration of p-type polysilicon is relatively low. The sign of the temperature coefficient is reversed as the impurity concentration becomes higher, and the sheet resistance of p-type polysilicon comes to have a positive temperature coefficient when the p-type polysilicon has a relatively high impurity concentration.

The impurity concentration of the p-type polysilicon at which the sign of the temperature coefficient of the contact resistance is reversed is not the same as the impurity concentration of the p-type polysilicon at which the temperature coefficient of the sheet resistance of the p-type polysilicon is reversed.

For example, when p-type polysilicon has a certain impurity concentration (first concentration), the sheet resistance of p-type polysilicon and the contact resistance of p-type polysilicon with metal may both have a negative temperature coefficient. Further, when the p-type polysilicon has another certain impurity concentration (second concentration) higher than the first concentration, the sheet resistance of the p-type polysilicon may have a positive temperature coefficient, and the contact resistance of the p-type polysilicon may have a negative temperature coefficient. Further, when the p-type polysilicon has yet another certain impurity concentration (third concentration) higher than the second concentration, the sheet resistance of the p-type polysilicon and the contact resistance of the p-type polysilicon with metal may both have a positive temperature coefficient.

In the semiconductor device according to the first embodiment, the low resistance contact structures (2a, 4a), (3a, 5a), the high resistance contact structures (2b, 1a), (2c, 1a), (2d, 1a), (3b, 1a), (3c, 1a), (3d, 1a), and the p-type resistance region 1a, which are between the first wiring 2 and the second wiring 3, all together constitute the entire resistor.

Here, the impurity concentrations of the resistance region 1a and the $p^+$-type contact regions 4a and 5a are adjusted such that among the contact resistance of the high resistance contact structures (2b, 1a), (2c, 1a), (2d, 1a), (3b, 1a), (3c, 1a), (3d, 1a), the contact resistance of the low resistance contact structures (2a, 4a) and (3a, 5a), and the sheet resistance of the p-type resistance region 1a, the temperature coefficient of at least one of them has a (plus or minus) sign opposite to the sign (plus or minus) of the temperature coefficient of at least another one of them. Here, among the contact resistance of the high resistance contact structures (2b, 1a), (2c, 1a), (2d, 1a), (3b, 1a), (3c, 1a), (3d, 1a) and the contact resistance of the low resistance contact structure (2a, 4a) and (3a, 5a), and the sheet resistance of the p-type resistance region 1a, the temperature coefficient of one of them may have a sign (plus or minus) opposite to the sign (plus or minus) of the temperature coefficient of another one of them, and the temperature coefficient of the rest may be zero. For example, the contact resistance of the high resistance contact structures (2b, 1a), (2c, 1a), (2d, 1a), (3b, 1a), (3c, 1a), (3d, 1a) has a negative temperature coefficient, the contact resistance of the low resistance contact structures (2a, 4a), (3a, 5a) has a positive temperature coefficient, and the sheet resistance of the p-type resistance region 1a has a positive temperature coefficient.

Here, the number of the vias 2b to 2d, 3b to 3d constituting the high resistance contact structures (2b, 1a), (2c, 1a), (2d, 1a), (3b, 1a), (3c, 1a), (3d, 1a), respectively, the number (percentage) of the vias 2a and 3a constituting the low resistance contact structures (2a, 4a) and (3a, 5a), respectively, and the number of sheets (as defined as the ratio of the length of the area to the width of the area) of the p-type resistance region 1a connected in series are adjusted in order to adjust the temperature coefficient of the entire resistance element. The number of the high resistance contact structures (2b, 1a), (2c, 1a), (2d, 1a), (3b, 1a), (3c, 1a), (3d, 1a) and the number of the low resistance contact structures (2a, 4a), (3a, 5a) are not particularly limited. Further, the percentage of the high resistance contact structures (2b, 1a), (2c, 1a), (2d, 1a), (3b, 1a), (3c, 1a), (3d, 1a) and the percentage of the low resistance contact structures (2a, 4a), (3a, 5a) are not particularly limited either. Although in FIG. 1, the number of the high resistance contact structures (2b, 1a), (2c, 1a), (2d, 1a), (3b, 1a), (3c, 1a), (3d, 1a) is greater than the number of the low resistance contact structures (2a, 4a), (3a, 5a), such a relationship may be reversed.

Here, it is preferable to adjust the number of the low resistance contact structures (2a, 4a), (3a, 5a), the number of the high resistance contact structures (2b, 1a), (2c, 1a), (2d, 1a), (3b, 1a), (3c, 1a), (3d, 1a), and the number of sheets of the p-type resistance region 1a connected in series, such that the temperature coefficient of the resistance of the entire resistor composed of the low resistance contact structures (2a, 4a), (3a, 5a), the high resistance contact structures (2b, 1a), (2c, 1a), (2d, 1a), (3b, 1a), (3c, 1a), (3d, 1a), and the p-type resistance region 1a becomes approximately zero (in other words, approaching to zero or a small value).

In the semiconductor device according to the first embodiment, the resistance value R of the entire resistance element when the arrangement of the high resistance contact structure and the low resistance contact structure on both end sides of the p-type resistance region 1a is symmetrical is given by the following formula (1).

$$R=[(RC1/n1)//(RC2/n2)]\times 2 + Rbd \times S \quad (1)$$

In formula (1), (RC1/n1)//(RC2/n2) is a resistance component of contacts disposed in parallel on one side of the p-type resistance region 1a. RC1 is the contact resistance of the high resistance contact structure, RC2 is the contact resistance of the low resistance contact structure, n1 is the number of the high resistance contact structures on one side of the p-type resistance region 1a, n2 is the number of the low resistance contact structures on one side of the p-type resistance region 1a, Rbd is the sheet resistance of the p-type resistance region 1a, and S is the number of sheets (as defined as the ratio of the length of the area to the width of the area) of the p-type resistance region 1a.

Figure 6:
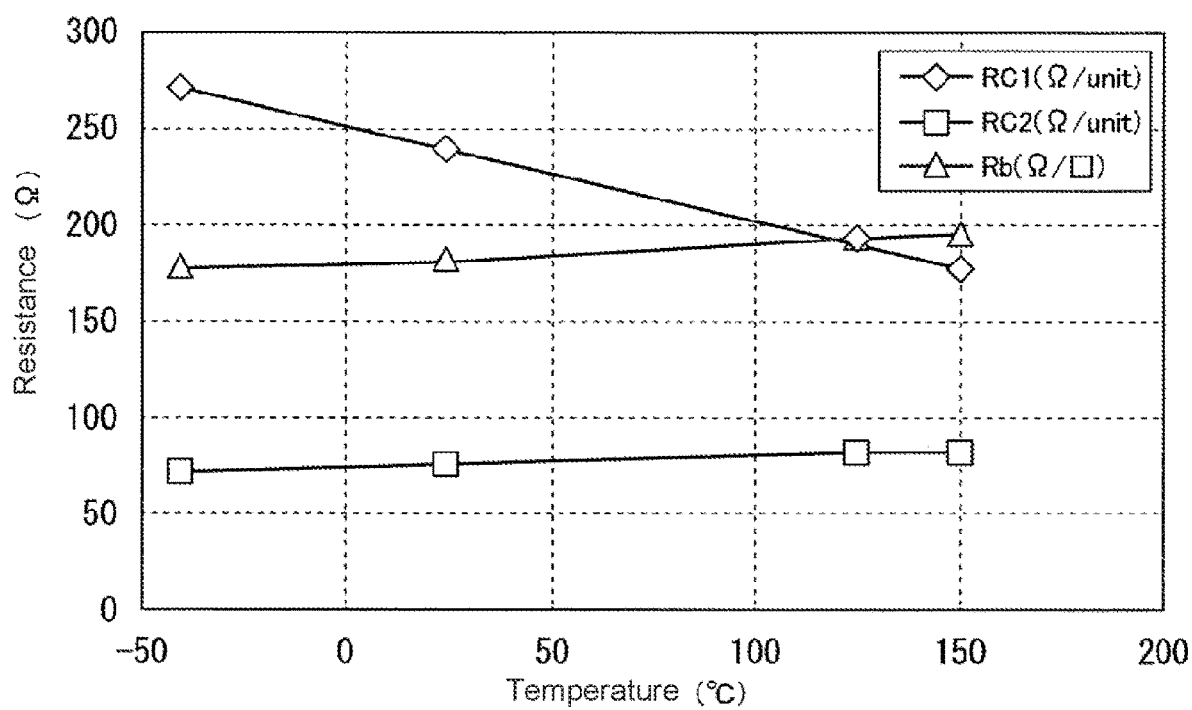
FIG. 6 is a graph showing the temperature dependence of the contact resistance of the low resistance contact structure, the contact resistance of the high resistance contact structure, and the sheet resistance of the resistance region.

FIG. 6 shows an example of the temperature dependencies of the contact resistance RC1 of the high resistance contact structure, the contact resistance RC2 of the low resistance contact structure, and the sheet resistance Rbd of the p-type resistance region 1a. As shown in FIG. 6, the contact resistance RC1 of the high resistance contact structure has a negative temperature coefficient, and the higher the temperature, the lower the resistance value. The contact resistance RC2 of the low resistance contact structure has a positive temperature coefficient, and the higher the temperature, the higher the resistance value. The sheet resistance Rbd of the p-type resistance region 1a has a positive temperature coefficient, and the higher the temperature, the higher the resistance value.

Figure 7:
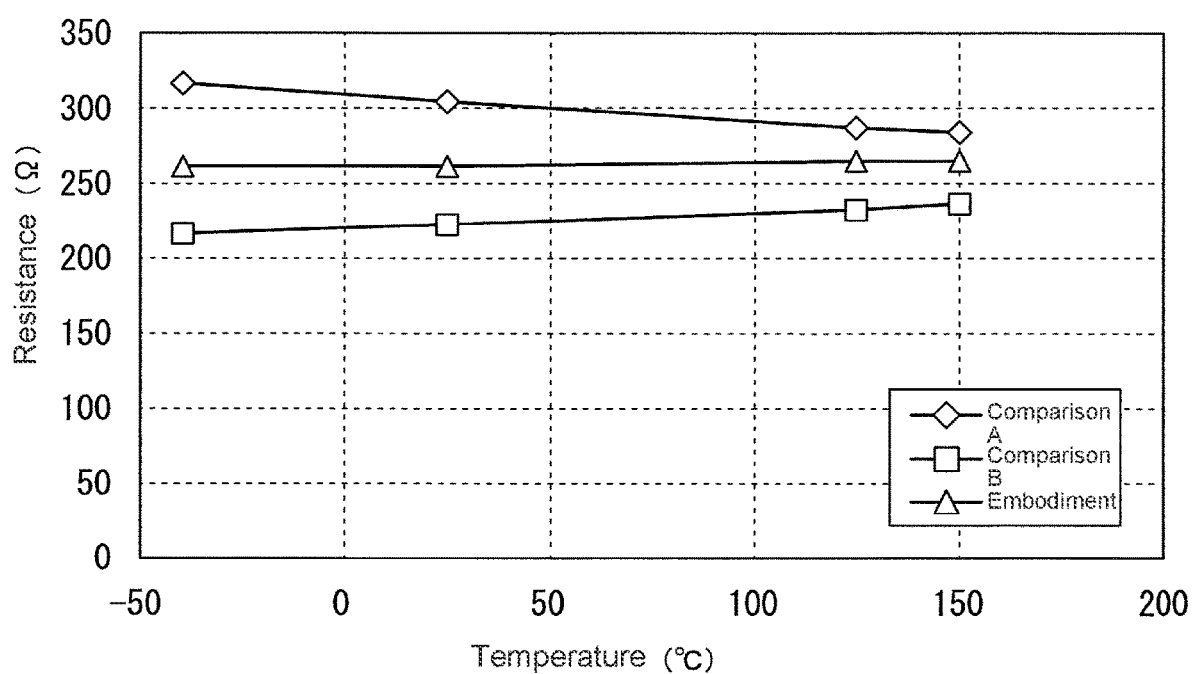
FIG. 7 is a graph showing the temperature dependence of the resistance values of Embodiment, Comparative Example A, and Comparative Example B.

FIG. 7 shows an example of the temperature dependence of the resistance value for an Embodiment corresponding to the semiconductor device according to the first embodiment, and Comparative Examples A and B for comparison with the example. The embodiment, as shown in FIG. 1, has a structure in which the high resistance contact structures and the low resistance contact structures are combined in which the number of the high resistance contact structures is set to 3 and the number of the low resistance contact structures is set to 1 on both sides of the p-type resistance region 1a, and the number of sheets of the p-type resistance region 1a is set to 1 sheet.

Comparative Example A has no low resistance contact structure and only has the high resistance contact structures, in which the number of the high resistance contact structures is set to 4 and the number of the low resistance contact structures is set to 0 on both sides of the p-type resistance region 1a, and the number of sheets of the p-type resistance region 1a is set to 1. Comparative Example B has no high resistance contact structures and only has the low resistance contact structures in which the number of the high resistance contact structures is set to 0 and the number of the low resistance contact structures is set to 4 on both sides of the p-type resistance region 1a, and the number of sheets of the p-type resistance region 1a is set to 1.

As shown in FIG. 7, in Comparative Example A, the higher the temperature, the lower the resistance value. In Comparative Example B, the higher the temperature, the higher the resistance value. In the embodiment, the resistance value slightly increases as the temperature rises, but the slope of the example is intermediate between that of the comparative example A and the comparative example B.

Figure 8:
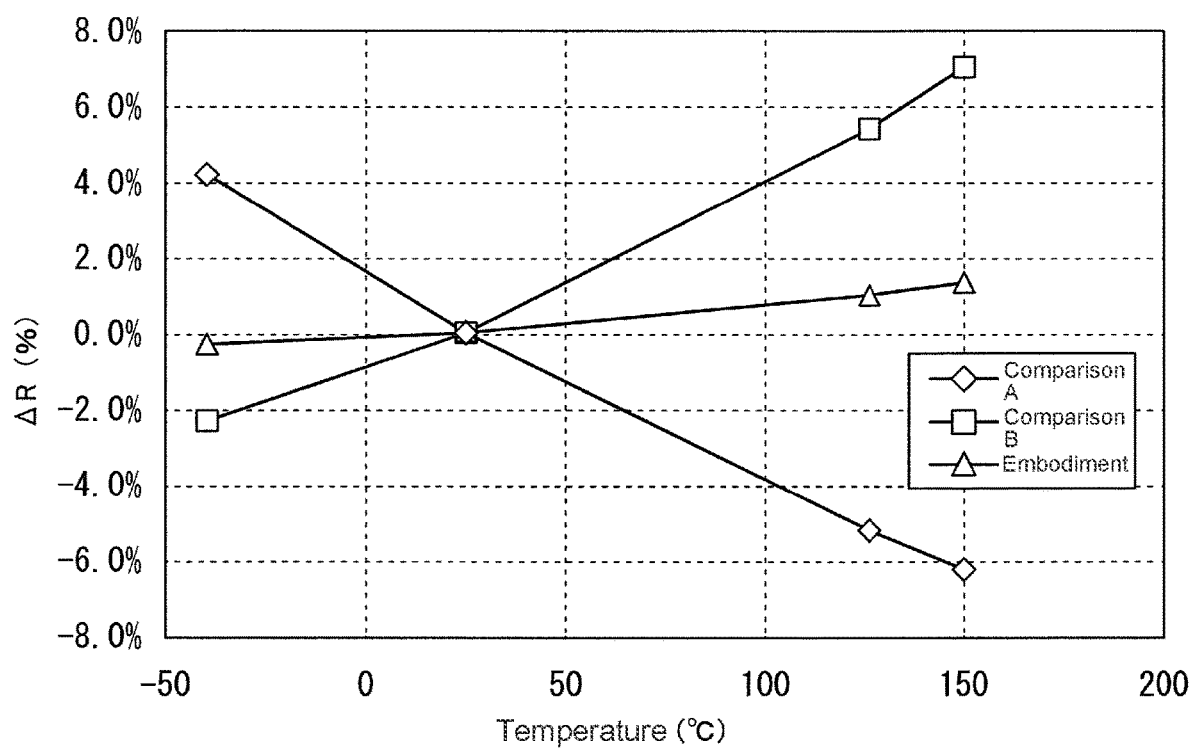
FIG. 8 is a graph showing the temperature dependence of the percentage change of the resistance values of the Embodiment, Comparative Example A, and Comparative Example B.

FIG. 8 shows an example of the temperature dependence of the percentage change ΔR of the resistance value relative to the resistance value at 25° C. for each of Comparative Example A, Comparative Example B, and Embodiment (Example) of FIG. 7. In Comparative Example A, the higher the temperature, the larger the percentage change ΔR of the resistance value in the negative direction. In Comparative Example B, the percentage change ΔR of the resistance value increases in the positive direction as the temperature increases. In the Embodiment, the percentage change ΔR of the resistance value slightly increases in the positive direction as the temperature rises, but the change amount is smaller than the Comparative Examples A and B.

Figure 9:
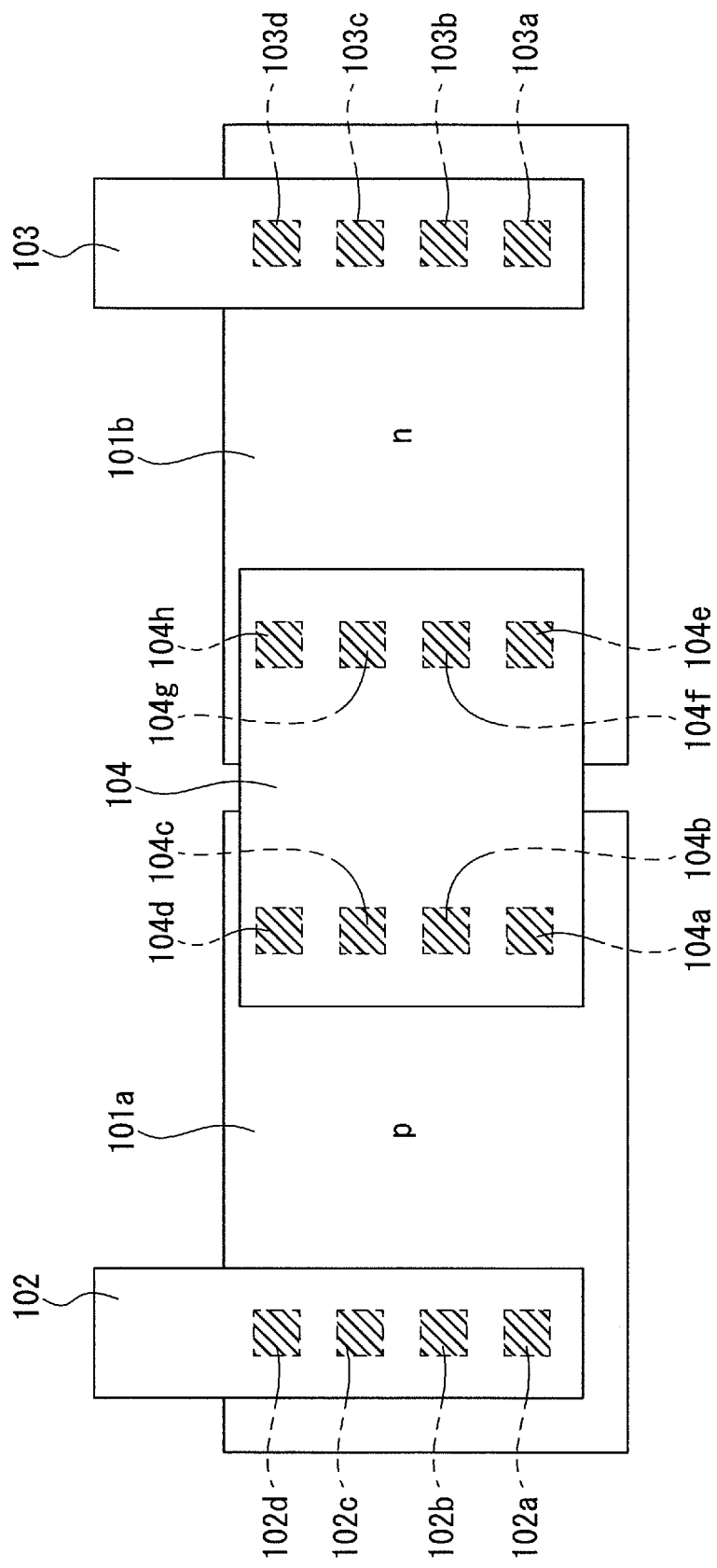
FIG. 9 is a plan view of a semiconductor device according to a first comparative example.

Next, semiconductor devices according to first and second comparative examples will be described. As shown in FIG. 9, the semiconductor device according to the first comparative differs from the semiconductor device of the first embodiment in that it uses two types of polysilicon layers, i.e., a first polysilicon layer 101a and a second polysilicon layer 101b. The first polysilicon layer 101a is made of p-type polysilicon, and the sheet resistance of the first polysilicon layer 101a has a positive temperature coefficient. The second polysilicon layer 101b is made of n-type polysilicon, and the sheet resistance of the second polysilicon layer 101b has a negative temperature coefficient.

One end side of the first polysilicon layer 101a is electrically connected to the first wiring 102 through vias 102a to 102d. The other end of the first polysilicon layer 101a is electrically connected to the relay wiring 104 via vias 104a-104d. The vias 102a-102d, 104a-104d are in contact with p+ type contact regions (not shown) provided in the first polysilicon layer 101a.

One end side of the second polysilicon layer 101b is electrically connected to the relay wiring 104 via vias 104e to 104h. The other end of the second polysilicon layer 101b is electrically connected to the second wiring 103 through vias 103a-103d. Vias 103a-103d and 104e-104h are in contact with n+ type contact regions (not shown) provided in the second polysilicon layer 101b.

In FIG. 9, the vias 102a to 102d and the vias 104a to 104d in contact with p$^+$-type contact regions (not shown) and the vias 103a to 103d and the vias 104e to 104h in contact with n$^+$-type contact regions (not shown) are hatched.

In the semiconductor device according to the first comparative example, the p$^+$-type contact region (not shown) and the n$^+$-type contact region (not shown) have high impurity concentrations so that the contact resistances of the vias 102a to 102d, 103a to 103d, and 104a to 104h are reduced to negligible levels.

Figure 10:
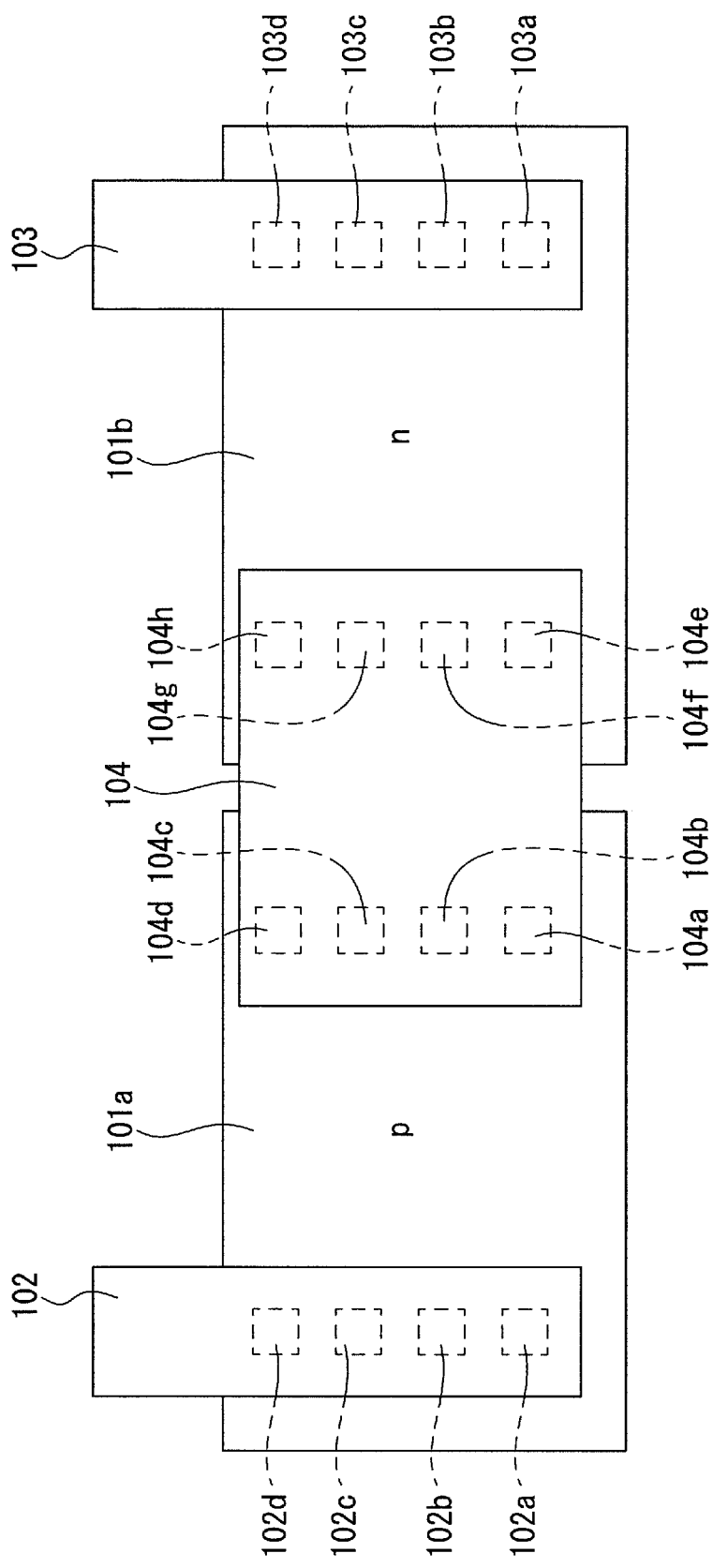
FIG. 10 is a plan view of a semiconductor device according to a second comparative example.

As shown in FIG. 10, the semiconductor device according to the second comparative example is similar to the first comparative example shown in FIG. 9 in that it includes the p-type first polysilicon layer 101a and the n-type second polysilicon layer 101b. But unlike the semiconductor device according to the first comparative example, in the semiconductor device according to the second comparative example, the first polysilicon layer 101a is not provided with the p$^+$-type contact regions, and the second polysilicon layer 101b is not provided with the n$^+$-type contact regions.

The vias 102a-102d and the vias 104a-104d are in contact with the first polysilicon layer 101a. The vias 103a-103d and the vias 104e-104h are in contact with the second polysilicon layer 101b. In FIG. 10, the vias 102a to 102d and the vias 104a to 104d in contact with the first polysilicon layer 101a and the vias 103a to 103d and the vias 104e to 104h in contact with the second polysilicon layer 101b are not hatched.

In the semiconductor device according to the second comparative example, the first polysilicon layer 101a and the second polysilicon layer 101b have a relatively high impurity concentration, and p$^+$-type contact region and n$^+$-type contact region are not provided.

In the semiconductor devices according to the first and second comparative examples, the temperature coefficient of the entire resistance element is adjusted by combining the first polysilicon layer 101a with a positive temperature coefficient and the second polysilicon layer 101b with a negative temperature coefficient. However, since two types of first polysilicon layer 101a and second polysilicon layer 101b are used, the area is increased. On the other hand, according to the semiconductor device of the first embodiment, one type of polysilicon layer 1 is used, and there is no need to prepare two types of polysilicon layers. This makes it possible to miniaturize a resistance element having a small temperature coefficient.

Here, the above-described semiconductor device of the first embodiment exemplified a case where the contact resistance of the high resistance contact structures (2b, 1a), (2c, 1a), (2d, 1a), (3b, 1a), (3c, 1a), (3d, 1a) has a negative temperature coefficient, the contact resistance of the low resistance contact structures (2a, 4a) and (3a, 5a) has a positive temperature coefficient, and the sheet resistance of the p-type resistance region 1a has a positive temperature coefficient. However, among the contact resistance of the high resistance contact structures (2b, 1a), (2c, 1a), (2d, 1a), (3b, 1a), (3c, 1a), (3d, 1a), the contact resistance of the low resistance contact structure (2a, 4a), (3a, 5a), and the sheet resistance of the p-type resistance region 1a, it is sufficient in some embodiments if the temperature coefficient of at least one of them is made different in sign from the temperature coefficient of at least another one of them.

For example, the contact resistance of the high resistance contact structures (2b, 1a), (2c, 1a), (2d, 1a), (3b, 1a), (3c, 1a), (3d, 1a) may have a negative temperature coefficient, the contact resistance of the low resistance contact structures (2a, 4a) and (3a, 5a) may have a positive temperature coefficient, and the sheet resistance of the p-type resistance region 1a may have a negative temperature coefficient. In order to make the sheet resistance of the p-type resistance region 1a to have a negative temperature coefficient, for example, the impurity concentration of the p-type resistance region 1a can be lowered.

Second Embodiment

Figure 11:
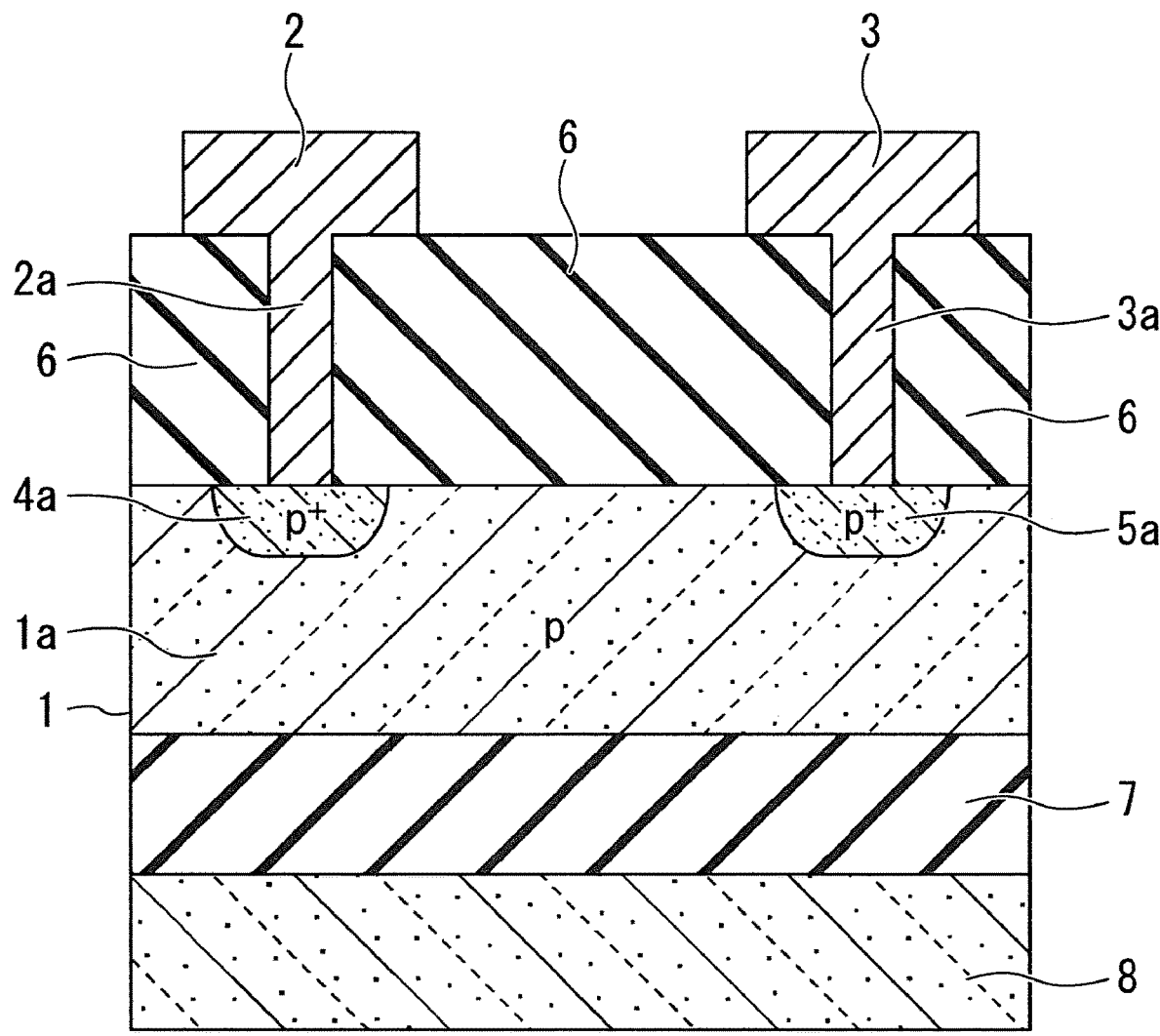
FIG. 11 is a cross-sectional view of a semiconductor device according to a second embodiment.

The semiconductor device according to a second embodiment differs from the semiconductor device of the first embodiment in that a p-type resistance region 1a is formed over the entire polysilicon layer 1, as shown in FIG. 11.

The cross section of the semiconductor device of the second embodiment shown in FIG. 11 corresponds to the cross section of the semiconductor device of the first embodiment in FIG. 2. The p-type resistance region 1a may be made of doped polysilicon in which the polysilicon layer 1 is doped with p-type impurities. Other configurations of the semiconductor device according to the second embodiment are substantially the same as those of the semiconductor device according to the first embodiment, and redundant description will be omitted.

According to the semiconductor device of the second embodiment, even when the p-type resistance region 1a is formed in the entire polysilicon layer 1, the same effects as those of the semiconductor device of the first embodiment can be obtained.

Third Embodiment

Figure 12:
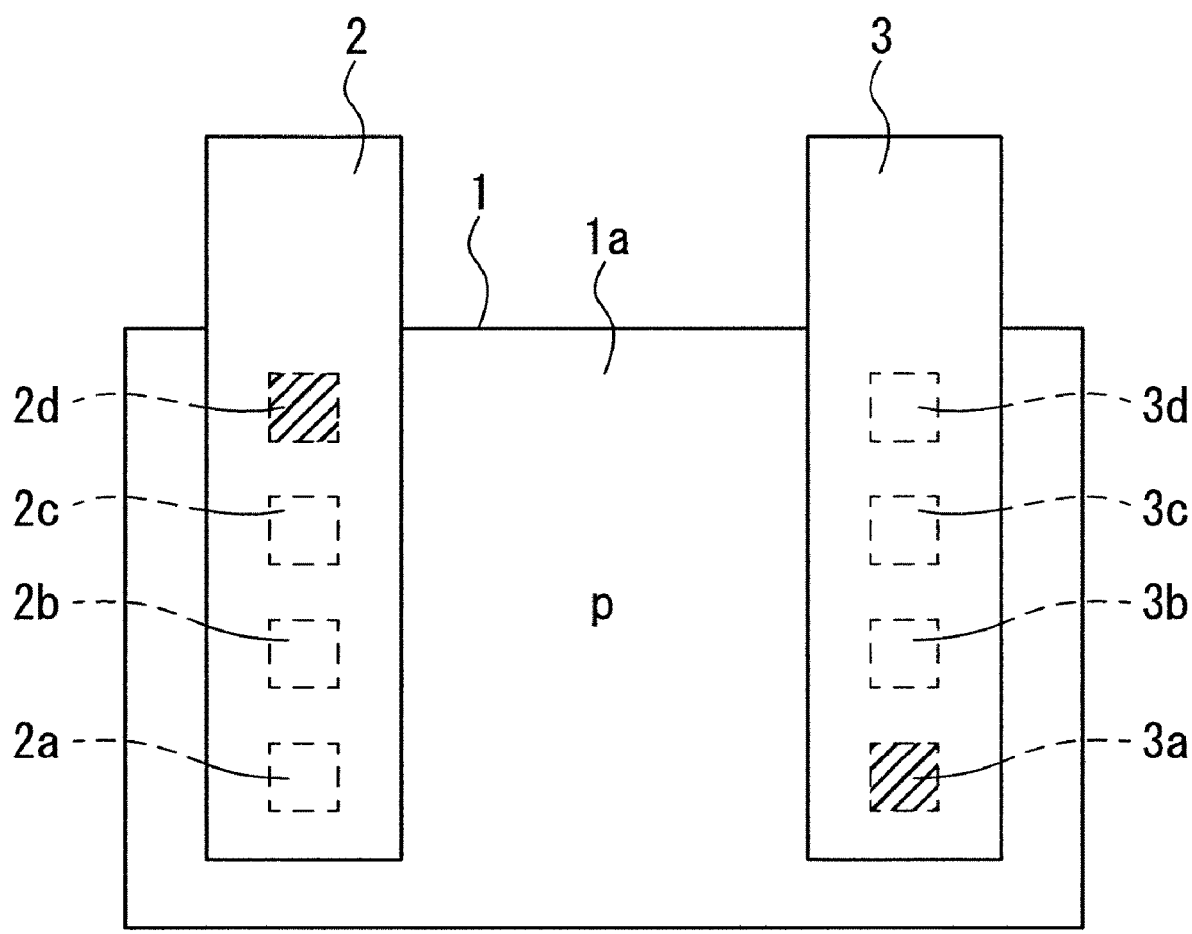
FIG. 12 is a plan view of a semiconductor device according to a third embodiment.

As shown in FIG. 12, a semiconductor device according to a third embodiment differs from the semiconductor device according to the first embodiment in that the low resistance contact structures and the high resistance contact structures formed by the vias 2a to 2d, which are connected to the first wiring 2, and the low resistance contact structures and the high resistance contact structures formed by the vias 3a to 3d, which are connected to the second wiring 3, are arranged asymmetrically (not line symmetrically).

In FIG. 12, the vias 2d and 3a forming the low resistance contact structures are hatched, and the vias 2a-2c and 3b-3d forming the high resistance contact structures are not hatched. Among the vias 2a to 2d connected to the first wiring 2, the vias 2a to 2c form high resistance contact structures and the via 2d forms a low resistance contact structure. On the other hand, among the vias 3a to 3d connected to the second wiring 3, the via 3a facing the via 2a forms a low resistance contact structure, and the vias 3b to 3d facing the vias 2b to 2d form high resistance contact structures. Other configurations of the semiconductor device of the third embodiment are substantially the same as those of the semiconductor device of the first embodiment, and redundant description will be omitted.

In the semiconductor device of the third embodiment, the same effects as in the semiconductor device according to the first embodiment can be obtained even though the low resistance contact structures and the high resistance contact structures formed by the vias 2a to 2d, which are connected to the first wiring 2, and the low resistance contact structures and the high resistance contact structures formed by the vias 3a to 3d, which are connected to the second wiring 3, are arranged asymmetrically.

Here, the number (percentage) of the low resistance contact structures relative to the high resistance contact structures formed by the vias 2a to 2d connected to the first wiring 2 may be different from the number (percentage) of the low resistance contact structures relative to the high resistance contact structures formed by the vias 3a to 3d connected to the second wiring 3.

Fourth Embodiment

Figure 13:
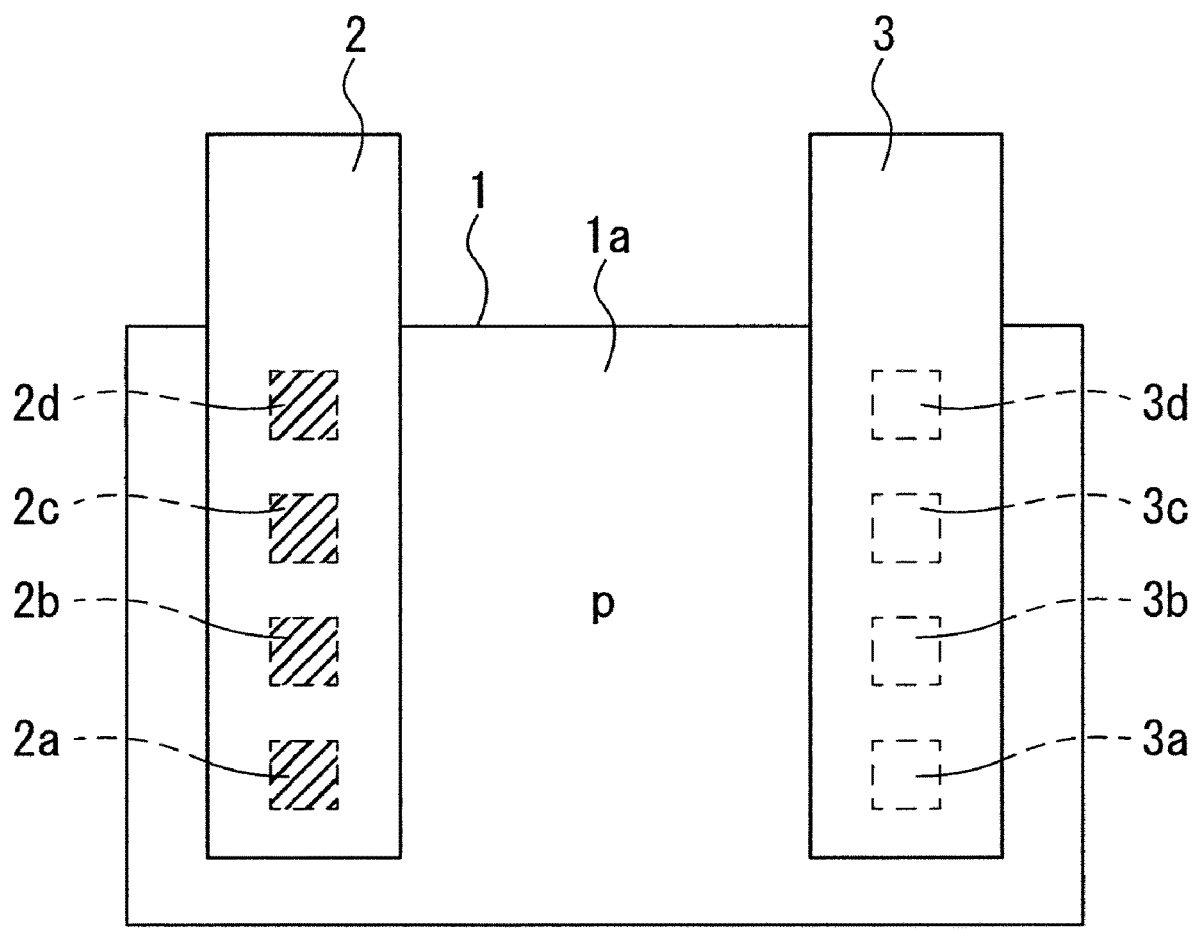
FIG. 13 is a plan view of a semiconductor device according to a fourth embodiment.

As shown in FIG. 13, a semiconductor device according to a fourth embodiment differs from the semiconductor device of the first embodiment in that the vias 2a to 2d connected to the first wiring 2 constitute only low resistance contact structures, and the vias 3a to 3d connected to the second wiring 3 constitutes only high resistance contact structures.

In FIG. 13, the vias 2a to 2d forming the low resistance contact structures are hatched, and the vias 3a to 3d forming the high resistance contact structures are not hatched. Other configurations of the semiconductor device of the fourth embodiment are substantially the same as those of the semiconductor device of the first embodiment, and redundant description will be omitted.

According to the semiconductor device of the fourth embodiment, the same effects as those of the semiconductor device of the first embodiment can be obtained even though the vias 2a to 2d connected to the first wiring 2 constitute only low resistance contact structures, and the vias 3a to 3d connected to the second wiring 3 constitutes only high resistance contact structures. That is, among a plurality of vias 2a to 2d and 3a to 3d, only some of them may form a low resistance contact structure, and the rest may form a high resistance contact structure.

Fifth Embodiment

Figure 14:
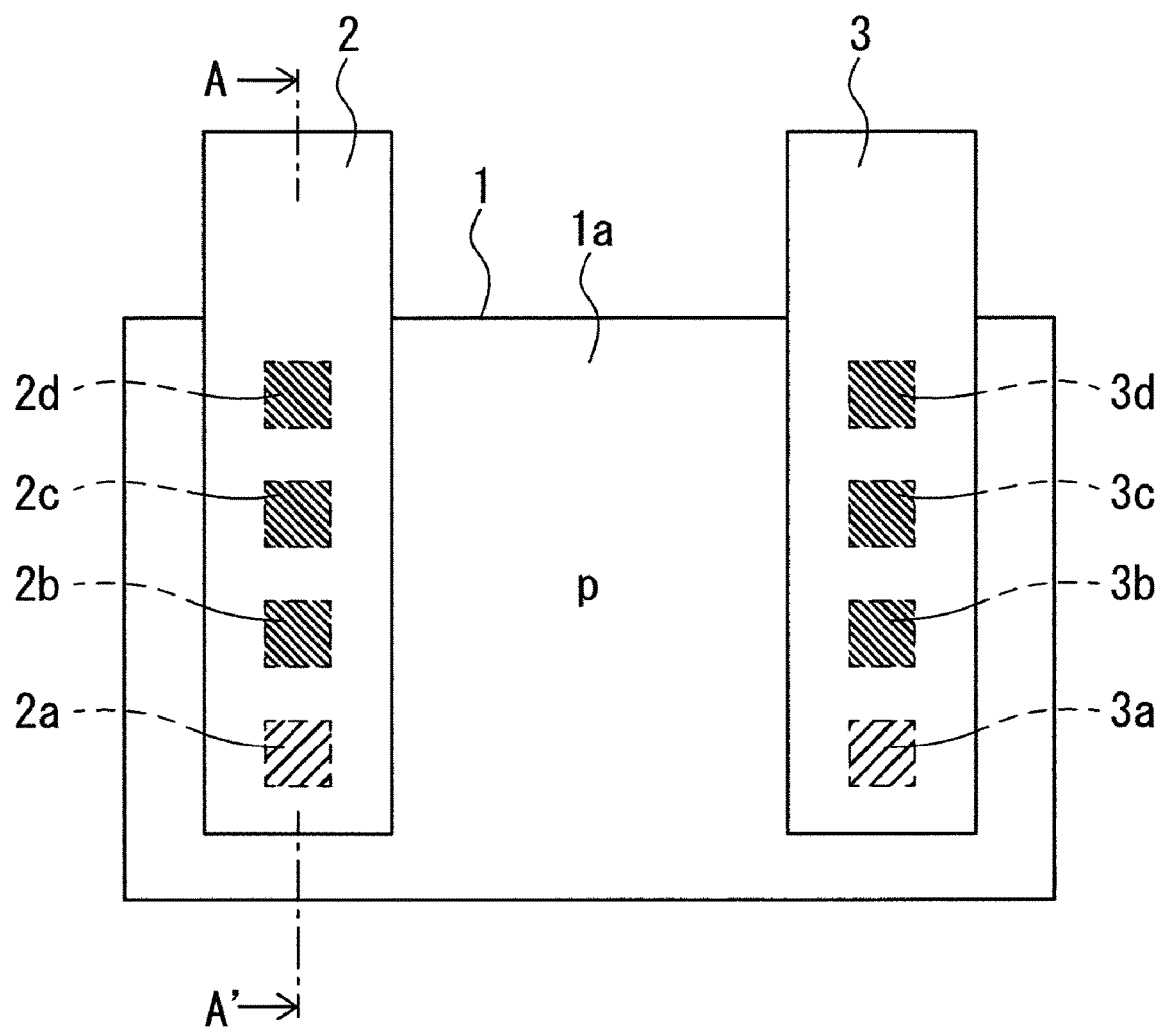
FIG. 14 is a plan view of a semiconductor device according to a fifth embodiment.

As shown in FIG. 14, a semiconductor device according to a fifth embodiment is similar to the semiconductor device of the first embodiment in that the vias 2a and 3a form low resistance contact structures and the vias 2b to 2d and the vias 3b to 3d form high resistance contact structures. In FIG. 14, the vias 2a and 3a forming the low resistance contact structures and the vias 2b to 2d and the vias 3b to 3d forming the high resistance contact structures are hatched differently from each other.

Figure 15:
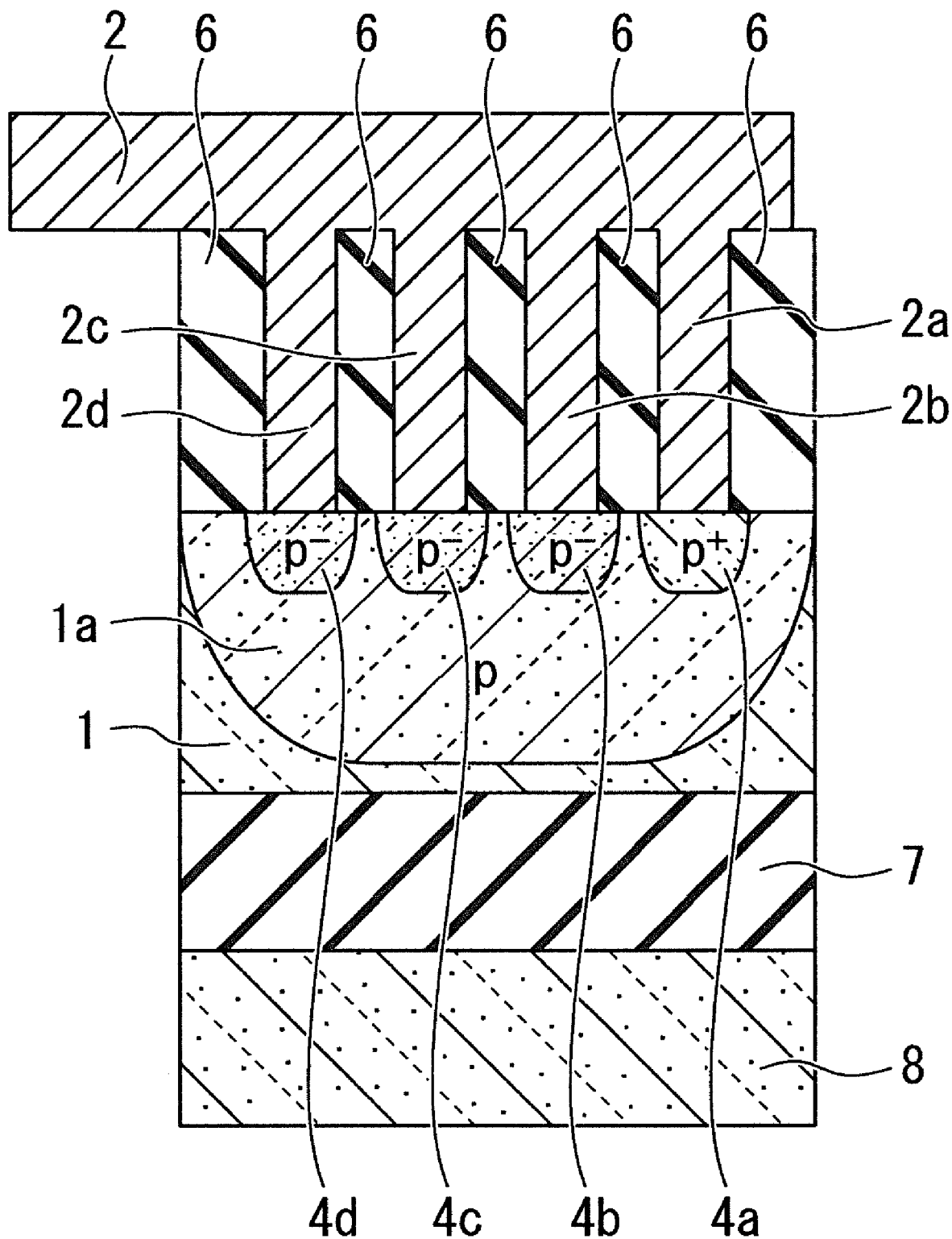
FIG. 15 is a cross-sectional view taken along the line A-A' in FIG. 14.

FIG. 15 shows a cross section taken along the line A-A' in FIG. 14. As shown in FIG. 15, the semiconductor device of the fifth embodiment differs from the semiconductor device of the first embodiment in that the vias 2b to 2d are in contact with $p^-$-type contact regions that have the same conductivity type as p-type resistance region 1a and that have a lower impurity concentration than p-type resistance region 1a so as to form high resistance contact structures (2b, 4b), (2c, 4c), and (2d, 4d), respectively.

The $p^-$-type contact regions 4b to 4d are provided in upper portions of the p-type resistance region 1a. The $p^-$-type contact regions 4b to 4d can be formed, for example, by ion-implanting (counter-doping) an n-type impurity into the polysilicon layer 1 to compensate for the p-type impurity.

In the semiconductor device of the fifth embodiment, similarly to the semiconductor device of the first embodiment, for example, the contact resistance of the high resistance contact structures (2b, 4b), (2c, 4c), (2d, 4d) may have a negative temperature coefficient, the contact resistance of the low resistance contact structures (2a, 4a) may have a positive temperature coefficient, and the sheet resistance of the p-type resistance region 1a may have a positive temperature coefficient.

Alternatively, the contact resistance of the high resistance contact structures (2b, 4b), (2c, 4c), (2d, 4d) may have a negative temperature coefficient, the contact resistance of the low resistance contact structures (2a, 4a) may have a positive temperature coefficient, and the sheet resistance of the p-type resistance region 1a may be a negative temperature coefficient.

The vias 3b to 3d also form high resistance contact structures that are in contact with $p^-$-type contact regions (not shown) provided in upper portions of the p-type resistance region 1a. Other configurations of the semiconductor device of the fifth embodiment are substantially the same as those of the semiconductor device of the first embodiment, and redundant description will be omitted.

The semiconductor device of the fifth embodiment has the same effects as the semiconductor device of the first embodiment. Furthermore, since the vias 2b-2d form high resistance contact structures (2b, 4b), (2c, 4c), (2d, 4d) in contact with the $p^-$-type contact regions 4b-4d, the contact resistance of the high resistance contact structures (2b, 4b), (2c, 4c), (2d, 4d) and the sheet resistance of the p-type resistance region 1a can be individually adjusted, and the temperature coefficient of the contact resistance of the high resistance contact structures (2b, 4b), (2c, 4c), (2d, 4d) and the temperature coefficient of the sheet resistance of the p-type resistance region 1a can also be individually adjusted.

Here, the via 2a may be configured to be in contact with a p-type contact region (not shown in the figure) that has the same conductivity type as the p-type resistance region 1a and that has an impurity concentration that is lower than the p-type resistance region 1a and higher than the $p^-$-type contact regions 4b to 4d so as to constitute a low resistance contact structure. In such a case, for example, the contact resistance of the high resistance contact structures (2b, 4b), (2c, 4c), (2d, 4d) may have a negative temperature coefficient, the contact resistance of the low resistance contact structure formed by the via 2a may have a negative temperature coefficient, and the sheet resistance of the p-type resistance region 1a may have a positive temperature coefficient.

Sixth Embodiment

Figure 16:
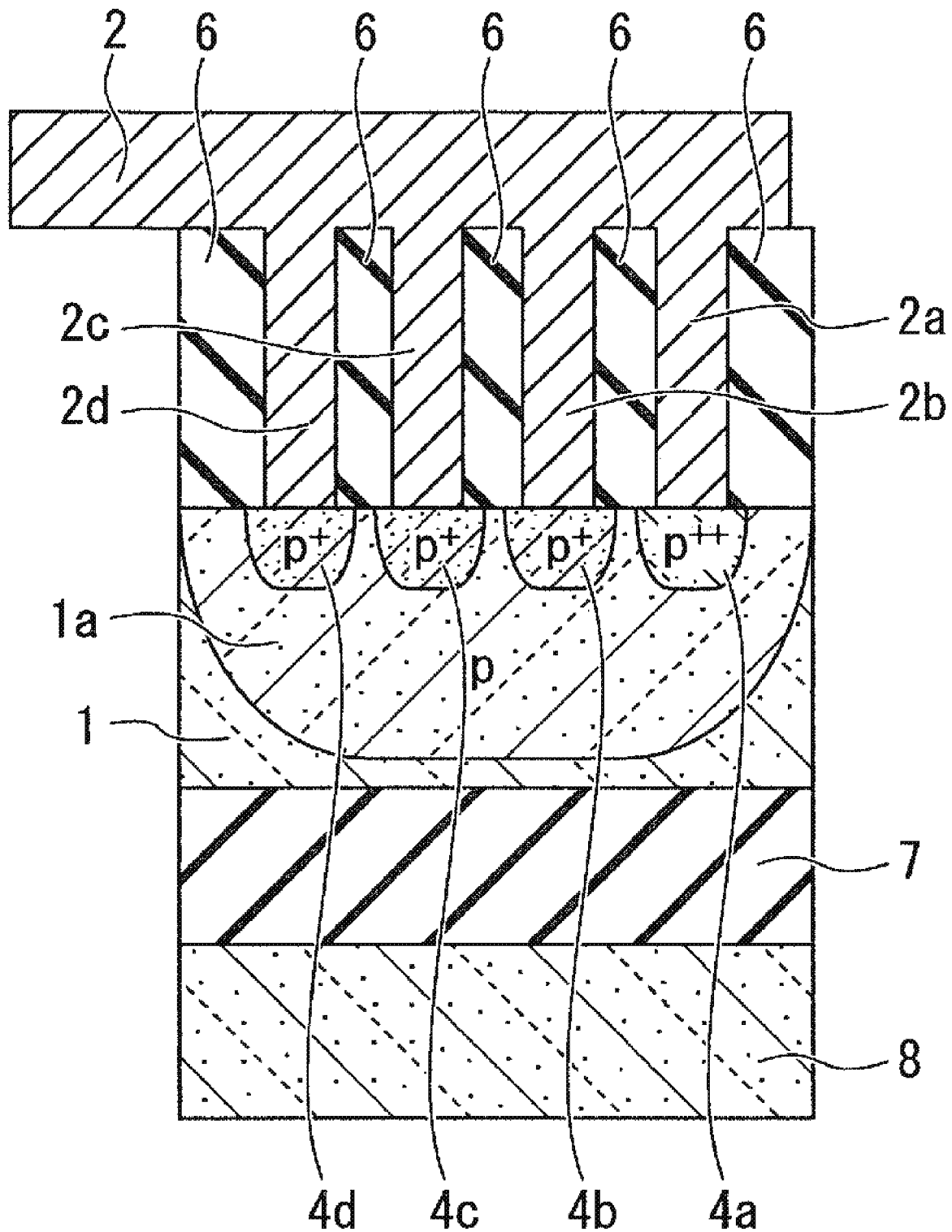
FIG. 16 is a cross-sectional view of a semiconductor device according to a sixth embodiment.

As shown in FIG. 16, a semiconductor device according to a sixth embodiment differs from the semiconductor device of the fifth embodiment in that the vias 2b to 2d are in contact with the $p^+$-type contact regions 4b to 4d that have the same conductivity type as the p-type resistance region 1a and that have a higher impurity concentration than the p-type resistance region 1a so as to form high resistance contact structures (2b, 4b), (2c, 4c), (2d, 4d). The cross section of the semiconductor device of the sixth embodiment shown in FIG. 16 corresponds to the cross section of the semiconductor device of the fifth embodiment shown in FIG. 15.

The $p^+$-type contact regions 4b to 4d are provided in upper portions of the p-type resistance region 1a. The $p^+$-type contact regions 4b to 4d have an impurity concentration that is higher than the p-type resistance region 1a and lower than the $p^+$-type contact region 4a. The $p^+$-type contact regions 4b to 4d can be formed by ion-implanting p-type impurities into the polysilicon layer 1, for example.

In the semiconductor device of the sixth embodiment, for example, similarly to the semiconductor device of the first embodiment, the contact resistance of the high resistance contact structures (2b, 4b), (2c, 4c), and (2d, 4d) may have a negative temperature coefficient, the contact resistance of the low resistance contact structures (2a, 4a) may have a positive temperature coefficient, and the sheet resistance of the p-type resistance region 1a may have a positive temperature coefficient.

Alternatively, the contact resistance of the high resistance contact structures (2b, 4b), (2c, 4c), and (2d, 4d) may have a negative temperature coefficient, the contact resistance of the low resistance contact structures (2a, 4a) may have a positive temperature coefficient, and the sheet resistance of the p-type resistance region 1a may have a negative temperature coefficient.

Alternatively, the contact resistance of the high resistance contact structures (2b, 4b), (2c, 4c), and (2d, 4d) may have a positive temperature coefficient, the contact resistance of the low resistance contact structures (2a, 4a) may have a positive temperature coefficient, and the sheet resistance of the p-type resistance region 1a may have a negative temperature coefficient. The vias 3b to 3d also form high resistance contact structures in contact with p$^+$-type contact regions (not shown) similar to the p$^+$-type contact regions 4b to 4d. Other configurations of the semiconductor device of the sixth embodiment are substantially the same as those of the semiconductor device of the fifth embodiment, and redundant description will be omitted.

The semiconductor device of the sixth embodiment has the same effects as the semiconductor device of the first embodiment. Furthermore, because the vias 2b to 2d are in contact with the p$^+$-type contact regions 4b to 4d to form the high resistance contact structures (2b, 4b), (2c, 4c), (2d, 4d), the contact resistance of the high resistance contact structures (2b, 4b), (2c, 4c), (2d, 4d) and the sheet resistance of the p-type resistance region 1a can be individually adjusted, and the temperature coefficient of the contact resistance of the high resistance contact structures (2b, 4b), (2c, 4c), (2d, 4d) and the temperature coefficient of the sheet resistance of the p-type resistance region 1a can also be individually adjusted.

Seventh Embodiment

Figure 17:
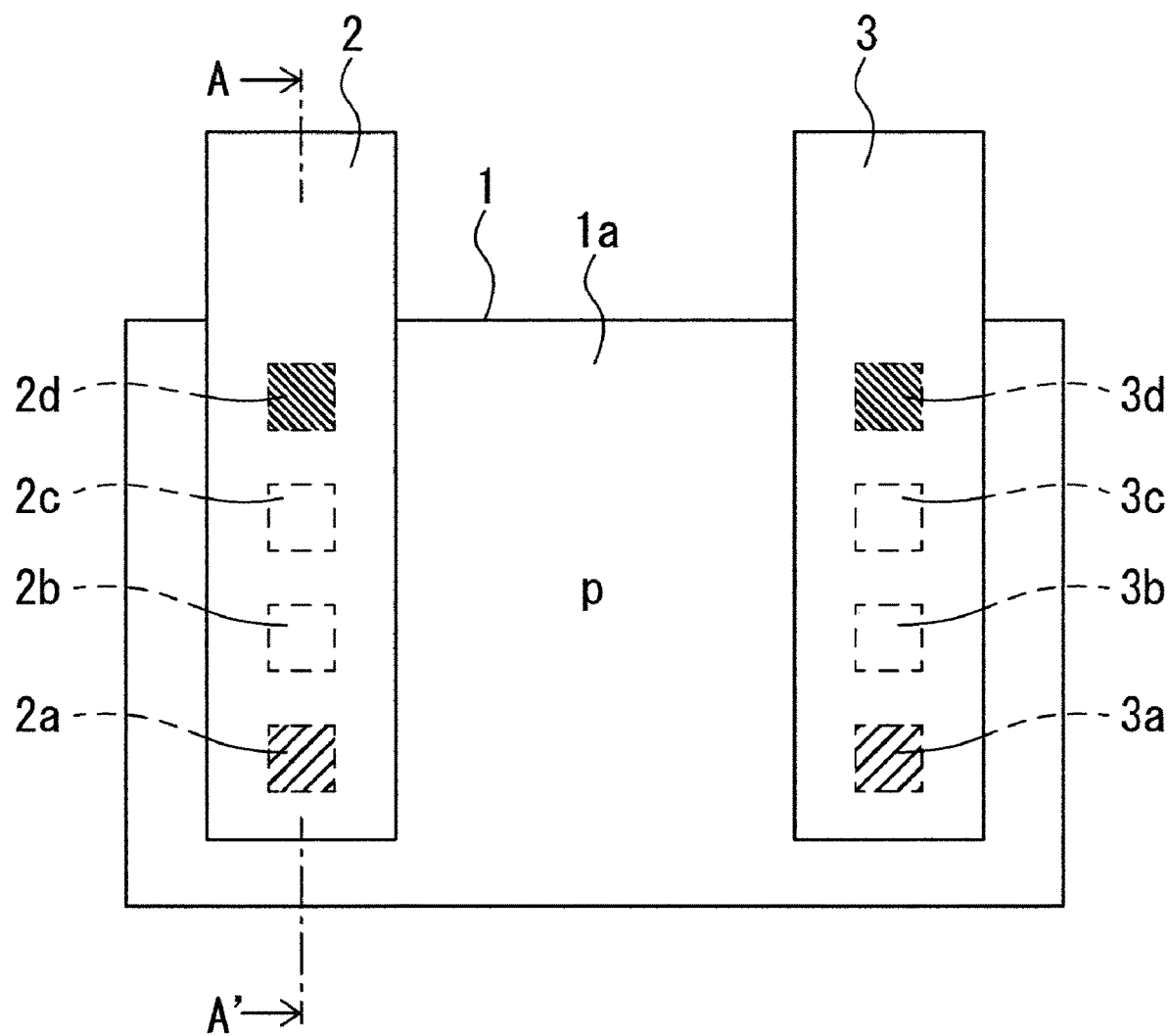
FIG. 17 is a plan view of a semiconductor device according to a seventh embodiment.

As shown in FIG. 17, a semiconductor device according to a seventh embodiment is similar to the semiconductor device of the first embodiment in that the vias 2a and 3a form low resistance contact structures, and the vias 2d and 3d form high resistance contact structures. However, the semiconductor device of the seventh embodiment differs from the semiconductor device of the first embodiment in that the vias 2b, 2c, 3b, 3c form contact structures having a contact resistance intermediate between the contact resistance of the low resistance contact structures and the contact resistance of the high resistance contact structures (hereinafter referred to as the "medium resistance contact structure").

In FIG. 17, the vias 2a and 3a forming the low resistance contact structures and the vias 2d and 3d forming the high resistance contact structures are hatched differently from each other. Also, the vias 2b, 2c, 3b, 3c forming the medium resistance contact structure are not hatched.

Figure 18:
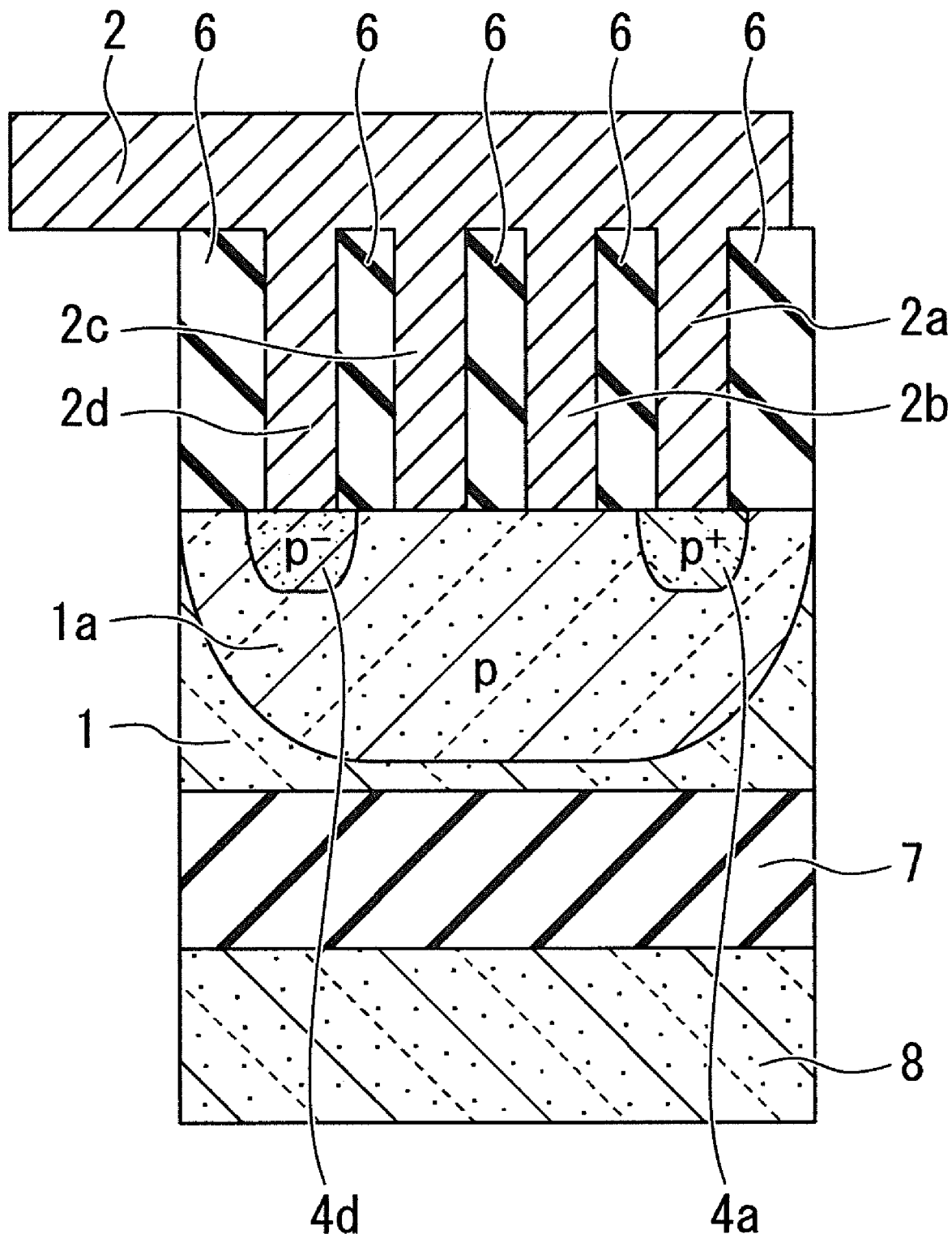
FIG. 18 is a cross-sectional view taken along the line A-A' in FIG. 17.

FIG. 18 shows a cross section taken along the line A-A' in FIG. 17. As shown in FIG. 18, the via 2a forms a low resistance contact structure (2a, 4a) in contact with the p$^+$-type contact region 4a. The p$^+$-type contact region 4a has the same conductivity type as the p-type resistance region 1a and has a higher impurity concentration than the p-type resistance region 1a.

The vias 2b and 2c are in contact with the p-type resistance region 1a to form medium resistance contact structures (2b, 1a) and (2c, 1a). The via 2d is in contact with the p$^-$-type contact region 4d to form a high resistance contact structure (2d, 4d). The p$^-$-type contact region 4d has the same conductivity type as the p-type resistance region 1a and has a lower impurity concentration than the p-type resistance region 1a.

In the semiconductor device of the seventh embodiment, for example, the contact resistance of the high resistance contact structures (2d, 4d) may have a negative temperature coefficient, the contact resistance of the low resistance contact structures (2a, 4a) may have a positive temperature coefficient, the sheet resistance of the p-type resistance region 1a may have a positive temperature coefficient, the contact resistance of the medium resistance contact structures (2b, 1a) and (2c, 1a) may have a positive or negative temperature coefficient.

Alternatively, the contact resistance of the high resistance contact structures (2d, 4d) may have a negative temperature coefficient, the contact resistance of the low resistance contact structures (2a, 4a) may have a positive temperature coefficient, the sheet resistance of the p-type resistance region 1a may have a negative temperature coefficient, and the contact resistance of the medium resistance contact structures (2b, 1a) and (2c, 1a) may have a positive or negative temperature coefficient. The vias 3a-3d shown in FIG. 17 also have the same contact structures as the vias 2a-2d. Other configurations of the semiconductor device of the seventh embodiment are substantially the same as those of the semiconductor device of the first embodiment, and redundant description will be omitted.

The semiconductor device of the seventh embodiment has the same effects as the semiconductor device of the first embodiment. Furthermore, in addition to the high resistance contact structures (2d, 4d) and the low resistance contact structures (2a, 4a), by further providing the medium resistance contact structures (2b, 1a), (2c, 1a), the resistance value and temperature coefficient of the entire resistor element can be finely tuned.

OTHER EMBODIMENTS

As described above, the present invention has been described with reference to the first to seventh embodiments, but it should be understood that the statements and drawings forming part of this disclosure do not limit the present invention. Various alternative embodiments, implementations and operational techniques will become apparent to those skilled in the art from this disclosure.

For example, in the semiconductor devices according to the first to seventh embodiments, the p$^+$-type contact region 4a is provided in the p-type resistance region 1a formed in the polysilicon layer 1, but an n-type diffusion region may be provided instead of the p-type resistance region 1a, and an n$^+$-type contact region may be provided in the n-type diffusion region.

The impurity concentration at which the temperature coefficient of the sheet resistance of the n-type polysilicon, which forms the n-type diffusion region and the n$^+$-type contact region, changes its sign is different from that for the p-type polysilicon. But similarly to the p-type polysilicon, when the impurity concentration of n-type polysilicon is relatively low, the temperature coefficient becomes negative, the temperature coefficient changes its sign as the impurity concentration increases, and when the impurity concentration of n-type polysilicon is relatively high, the temperature coefficient becomes positive.

Similarly to p-type polysilicon, the contact resistance of n-type polysilicon with a via has a negative temperature coefficient when the impurity concentration of n-type polysilicon is relatively low. The temperature coefficient of the contact resistant changes its sign as the impurity concentration increases, and when the n-type polysilicon has a relatively high impurity concentration, the temperature coefficient becomes positive. Therefore, even in the case of n-type polysilicon, the same configuration as in the case of p-type polysilicon is possible.

In addition, the semiconductor devices according to the first to seventh embodiments are applicable as long as they have a structure having a resistive element, and are applicable to power integrated circuits (power ICs) as well as general ICs other than power ICs.

Also, the configurations disclosed in the first to seventh embodiments can be appropriately combined within a range that does not cause contradiction. Thus, the present invention naturally includes various embodiments and the like that are not described here. Therefore, the technical scope of the present invention is defined only by the subject matter specified by claims based on the above descriptions.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
a polysilicon layer;
a resistance region provided in the polysilicon layer;
a first contact region provided in the resistance region, the first contact region having the same conductivity type as the resistance region and having a higher impurity concentration than the resistance region;
a first wiring electrically connected to one end of the resistance region via a plurality of first vias; and
a second wiring electrically connected to the other end of the resistance region via a plurality of second vias,
wherein at least one of the plurality of first vias and the plurality of second vias is in contact with the first contact region so as to form a low resistance contact structure with respect to the resistance region, and
wherein at least another one of the plurality of first vias and the plurality of second vias forms a high resistance contact structure with respect to the resistance region that has a contact resistance higher than a contact resistance of the low resistance contact structure.

2. The semiconductor device according to claim 1, wherein at least one of the contact resistance of the low resistance contact structure, the contact resistance of the high resistance contact structure, and a sheet resistance of the resistance region has a temperature coefficient that has a plus or negative sign opposite to a temperature coefficient of at least another one of the contact resistance of the low resistance contact structure, the contact resistance of the high resistance contact structure, and the sheet resistance of the resistance region.

3. The semiconductor device according to claim 1, wherein the contact resistance of the low resistance contact structure has a positive temperature coefficient, the contact resistance of the high resistance contact structure has a negative temperature coefficient, and a sheet resistance of the resistance region has a positive temperature coefficient.

4. The semiconductor device according to claim 1, wherein a number of the low resistance contact structure, a number of the high resistance contact structures, and lateral dimensions of the resistance region are such that a temperature coefficient of an entire resistance of a resistor composed of the low resistance contact structure, the high resistance contact structure, and the resistance region is substantially zero.

5. The semiconductor device according to claim 1, wherein said at least another one of the plurality of first vias and the plurality of second vias is directly in contact with the resistance region to form the high resistance contact structure.

6. The semiconductor device according to claim 1, further comprising a second contact region in the resistance region, the second contact region having the same conductivity type as the resistance region and having a lower impurity concentration than the resistance region,
wherein said at least another one of the plurality of first vias and the plurality of second vias is in contact with the second contact region so as to form the high resistance contact structure with respect to the resistance region.

7. The semiconductor device according to claim 1, further comprising a second contact region in the resistance region, the second contact region having the same conductivity type as the resistance region and having an impurity concentration that is higher than an impurity concentration of the resistance region and that is lower than the impurity concentration of the first contact region,
wherein said at least another one of the plurality of first vias and the plurality of second vias is in contact with the second contact region so as to form the high resistance contact structure with respect to the resistance region.

8. The semiconductor device according to claim 1, further comprising a second contact region in the resistance region, the second contact region having the same conductivity type as the resistance region and having a lower impurity concentration than the resistance region,
wherein said at least another one of the plurality of first vias and the plurality of second vias is in contact with the second contact region so as to form the high resistance contact structure with respect to the resistance region, and
wherein still another one of the plurality of first vias and the plurality of second vias is directly in contact with the resistance region so as to form a middle resistance contact structure with respect to the resistance region that has a contact resistance between the contact resistance of the high resistance contact structure and the contact resistance of the low resistance contact structure.

9. The semiconductor device according to claim 1,
wherein said at least one of the plurality of first vias and the plurality of second vias constituting the low resistance contact structure is one or more of the plurality of first vias, and
wherein said at least another one of the plurality of first vias and the plurality of second vias constituting the high resistance contact structure is another one or more of the plurality of first vias.

10. The semiconductor device according to claim 9,
wherein the plurality of second vias have the same configuration as the plurality of first vias, and the plurality of first vias and the plurality of second vias are arranged line symmetrically with respect to each other.

11. The semiconductor device according to claim 1, wherein said resistance region is a p-type diffusion region.

* * * * *